US012713683B2

(12) United States Patent
Su et al.

(10) Patent No.: US 12,713,683 B2
(45) Date of Patent: Aug. 18, 2026

(54) GATE STRUCTURE FOR SEMICONDUCTOR DEVICE

(71) Applicant: Taiwan Semiconductor Manufacturing Co., Ltd., Hsinchu (TW)

(72) Inventors: Huan-Chieh Su, Tianzhong Township (TW); Chih-Hao Wang, Baoshan Township (TW); Kuo-Cheng Ching, Zhubei City (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/815,428

(22) Filed: Jul. 27, 2022

(65) Prior Publication Data

US 2022/0359704 A1 Nov. 10, 2022

Related U.S. Application Data

(62) Division of application No. 16/596,009, filed on Oct. 8, 2019, now Pat. No. 12,495,601.

(51) Int. Cl.

| | |
|---|---|
| ***H10D 64/66*** | (2025.01) |
| ***H01L 21/02*** | (2006.01) |
| ***H10D 30/62*** | (2025.01) |
| ***H10D 30/67*** | (2025.01) |
| ***H10D 62/10*** | (2025.01) |
| ***H10D 62/13*** | (2025.01) |
| ***H10D 62/17*** | (2025.01) |
| ***H10D 62/83*** | (2025.01) |
| ***H10D 64/01*** | (2025.01) |

(Continued)

(52) U.S. Cl.

CPC ........... *H10D 64/671* (2025.01); *H10D 30/62* (2025.01); *H10D 30/6735* (2025.01); *H10D 62/121* (2025.01); *H10D 62/151* (2025.01); *H10D 62/292* (2025.01); *H10D 62/83* (2025.01); *H10D 64/01* (2025.01); *H10D 64/017* (2025.01); *H10D 64/691* (2025.01); *H10D 84/0135* (2025.01); *H10D 84/038* (2025.01); *H10D 84/834* (2025.01); *H10P 14/24* (2026.01); *H10P 14/3411* (2026.01)

(58) Field of Classification Search

CPC ......... H01L 29/78696; H01L 29/42392; H01L 29/0673; H01L 29/0665

See application file for complete search history.

(56) References Cited

U.S. PATENT DOCUMENTS 10,367,077 B1 * 7/2019 Loubet .............. H01L 29/66439
10,832,916 B1 11/2020 Xie et al.

(Continued)

*Primary Examiner* — Jesse Y Miyoshi

(74) *Attorney, Agent, or Firm* — Sterne, Kessler, Goldstein & Fox P.L.L.C.

(57) ABSTRACT

The present disclosure describes semiconductor structure and a method for forming the same. The semiconductor structure can include a substrate and a gate structure over the substrate, where the gate structure can include two opposing spacers, a dielectric layer formed on side surfaces of the two opposing spacers, and a gate metal stack formed over the dielectric layer. A top surface of the gate metal stack can be below a top surface of the dielectric layer. An example benefit of the semiconductor structure is to improve structure integrity of tight-pitch transistors in integrated circuits.

20 Claims, 27 Drawing Sheets

(51) Int. Cl.

| | |
|---|---|
| ***H10D 64/68*** | (2025.01) |
| ***H10D 84/01*** | (2025.01) |
| ***H10D 84/03*** | (2025.01) |
| ***H10D 84/83*** | (2025.01) |
| ***H10P 14/20*** | (2026.01) |
| ***H10P 14/24*** | (2026.01) |

(56) References Cited

U.S. PATENT DOCUMENTS

| | | | | |
|---|---|---|---|---|
| 2015/0340457 | A1 | 11/2015 | Xie et al. | |
| 2017/0256611 | A1 | 9/2017 | Kim et al. | |
| 2018/0033866 | A1* | 2/2018 | Liao | H01L 29/42376 |
| 2019/0259619 | A1* | 8/2019 | Zang | H01L 29/785 |
| 2020/0083222 | A1 | 3/2020 | Kim et al. | |
| 2021/0104616 | A1 | 4/2021 | Su et al. | |

* cited by examiner

GATE STRUCTURE FOR SEMICONDUCTOR DEVICE

CROSS-REFERENCE TO RELATED APPLICATION

This patent application is a divisional of U.S. patent application Ser. No. 16/596,009, filed on Oct. 8, 2019 and titled "Gate Structure for Semiconductor Device," which is incorporated by reference herein in its entirety.

BACKGROUND

Advances in semiconductor technology have increased the demand for semiconductor devices with higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs, fin field effect transistors (finFETs), and nano-sheet FETs. Such scaling down has increased the complexity of semiconductor manufacturing processes.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

Illustrative embodiments will now be described with reference to the accompanying drawings. In the drawings, like reference numerals generally indicate identical, functionally similar, and/or structurally similar elements.

DETAILED DESCRIPTION

Figure 1A:
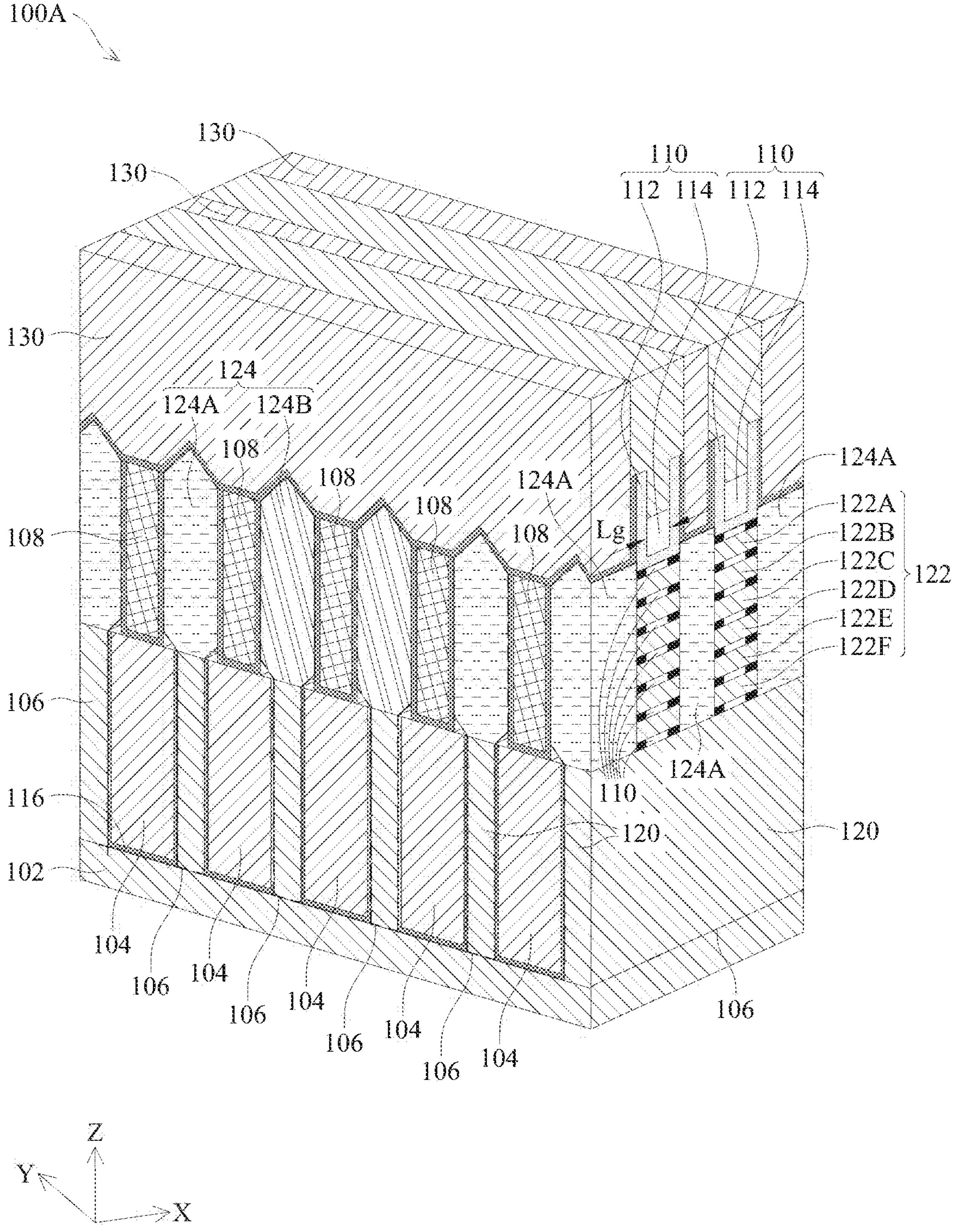
FIG. 1A is an isometric view of a semiconductor device, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "underlying," "underneath," "below," "lower," "above," "upper," "lower," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fins associated with fin field effect transistors (finFETs) or nano-sheet FETs may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "nominal" refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of the value (e.g., ±1%, ±2%, ±3%, ±4%, ±5% of the value).

As used herein, the term "vertical" means nominally perpendicular to a surface, such as a substrate's surface.

As used herein, the term "selectivity" refers to the ratio of the etch rates of two materials under the same etching conditions.

As used herein, the term "high-k" refers to a high dielectric constant. In some embodiments, high-k refers to a dielectric constant that is greater than the dielectric constant of $SiO_2$ (e.g., greater than 7.0).

As used herein, the term "low-k" refers to a small dielectric constant. In some embodiments, low-k refers to a dielectric constant that is less than the dielectric constant of $SiO_2$ (e.g., less than 7.0).

Technology advances in the semiconductor industry drive the pursuit of integrated circuit (IC) having higher device density, higher performance, and lower cost. In the course of evolution, various three dimensional (3D) field-effect transistors (FETs), such as fin-type field effect transistor (FinFET) and nano-sheet FETs, have been adopted to replace planar transistor to achieve ICs with higher device densities. Additionally, a cut metal gate scheme has been proposed to further increase IC device density by employing dielectric fin structures to separate metal gate tines between transistors within the IC. However, the dielectric fin structures can be vulnerable to subsequent semiconductor device processes, such as a metal gate etching process that can damage the dielectric fin structures. Such damage can compromise the electrical isolation provided by the dielectric fin structures, thus causing IC failures.

The present disclosure is directed to a fabrication method and structures that provide gate metal line isolation for transistors within an IC. In some embodiments, the structures can include a transistor gate structure and a fin isolation structure. In some embodiments, the transistor gate structure can include a spacer, a high-k gate dielectric disposed over the spacer's sidewall, and a gate metal stack formed over a lower portion of the high-k gate dielectric while exposing an upper portion of the high-k gate dielectric. In some embodiments, a top of the gate metal stack can be below a top of the spacer. The fin isolation structure can include a low-k dielectric layer and a high-k dielectric layer disposed over the low-k dielectric layer. An upper portion of the fin isolation structure can be above a top surface of the gate metal stack. In some embodiments, an upper portion of the transistor gate structure's spacer can be above a top surface of the fin isolation structure. A benefit of the present disclosure is to improve IC's yield by utilizing the high-k dielectric layer and the high-k gate dielectric to respectively protect the integrity of the fin isolation structure and the gate structure's spacer, thus avoiding transistor failures within the IC.

FIG. 1A is an isometric view of a device 100A, according to some embodiments. Device 100A can be a collection of one or more FinFETs, a collection of one or more nano-sheet FETs, a collection of one or more nano-wire FETs, or collection of one or more of any other type of FETs. Device 100A can be included in a microprocessor, memory cell, or other integrated circuit. The view of device 100A in FIG. 1A is shown for illustration purposes and may not be drawn to scale.

As shown in FIG. 1A, device 100A can be formed on a substrate 102 and can include one or more field-effect transistors (FETs) 106 and multiple isolation structures 108. Device 100A can further include multiple shallow trench isolation (STI) regions 104, multiple gate structures 110, and multiple interlayer dielectric (ILD) structures 130 formed on opposite sides of gate structure 110.

Substrate 102 can be a physical material on which FETs 106 and isolation structures 108 are formed. Substrate 102 can be a semiconductor material, such as silicon. In some embodiments, substrate 102 can include a crystalline silicon substrate (e.g., wafer). In some embodiments, substrate 102 can include (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 102 can be doped depending on design requirements (e.g., p-type substrate or n-type substrate). In some embodiments, substrate 102 can be doped with p-type dopants (e.g., boron, indium, aluminum, or gallium) or n-type dopants (e.g., phosphorus or arsenic). In some embodiments, substrate 102 can include a glass substrate. In some embodiments, substrate 102 can include a flexible substrate made of, for example, plastic. In some embodiments, substrate 102 can include a crystalline substrate, where a top surface substrate 102 can be parallel to (100), (110), (111), c-plane (0001) crystal plane.

STI regions 104 can provide electrical isolation to FETs 106 from each other and from neighboring active and passive elements (not illustrated herein) integrated with or deposited onto substrate 102. STI regions 104 can be made of a dielectric material. In some embodiments, STI regions 104 can include silicon oxide ($SiO_x$), silicon nitride ($SiN_x$), silicon oxynitride (SiON), fluorine-doped silicate glass (PSG), a low-k dielectric material, and/or other suitable insulating material. In some embodiments, STI regions 104 can include a multi-layered structure. In some embodiments, a liner 116, made of any suitable insulating material, can be placed between STI region 104 and the adjacent FETs 106.

As illustrated in FIG. 1A, each FET 106 can be a vertical structure traversing along an x-axis and through gate structures 110, In some embodiments, FET 106 can be a vertical structure oriented along <110>, <111>, or <100> crystal direction, FET 106 can include a buffer region 120 formed over substrate 102. In some embodiments, top surfaces of buffer regions 120 can be below or coplanar with top surfaces of STI regions 104. FET 106 can also include a channel region 122 formed over buffer region 120. Channel region 122 can include at least one channel layer that is made of at least one semiconductor layer. For example, FIG. 1A illustrates six channel layers 122A-122F, where each of the six channel layers can include at least a silicon layer or a silicon germanium layer. Although FIG. 1A shows six channel layers 122A-122F, any number of channel layers can be included in channel region 122. Since FET 106 can horizontally (e.g., in the x-direction) traverse through gate structure 110, a portion of channel region 122 can be formed under gate structure 110 and another portion of channel region 122 (covered by source-drain region 124; not shown in FIG. 1A) can be formed horizontally (e.g., in the x-direction) outside gate structure 110. In some embodiments, device 100A can be a collection of one or more FinFETs, where a top surface and side surfaces of the portion of channel regions 122 under gate structure 110 can be in physical contact with gate structure 110, In some embodiments, as shown in FIG. 1A, device 100A can be a collections of one or more nano-sheet FETs or a collection of one or more nano-wire FETs, where a top surface, side surfaces, and the bottom surface the portion of channel regions 122 under gate structure 110 can be in physical contact with gate structure 110.

In some embodiments, device 100A can be a collection of one or more nano-sheet FETs or a collection of one or more nano-wire FETs, where channel region 122 can include a first portion with alternating first channel layers (not shown in FIG. 1A; buried within source-drain 124) and second channel layers (e.g., channel layers 122A-122F), and a second portion with the second channel layers (e.g., channel layers 122A-122F). The second channel layers from the first portion of channel region 122 can extend through the second portion of channel region 122. Gate structure 110 can be formed over the second portion of the channel region 122. In some embodiments, gate structure 110 can surround the second channel layers of the second portion of channel region 122.

FET 106 can further include a source-drain region 124 formed over a portion of channel region 122 and over buffer region 120. For example, source-drain 124 can wrap around the other portion of channel region 122 that is horizontally (e.g., in the x-direction) outside gate structure 110. In some embodiments, channel region 122 and source-drain region 124 can be positioned above top surfaces of STI regions 104. In some embodiments, bottom surfaces of channel region 122 and bottom surfaces of source-drain region 124 can be above or substantially coplanar with top surfaces of STI regions 104.

Channel regions 122 can be current-carrying structures for device 100A. Source-drain region 124 that covers portions of channel region 122 can be configured to function as source/drain (S/D) regions of device 100A. Channels of device 100E can be formed in portions of channel region 122 under gate structures 110.

Each of buffer region 120 and channel region 122 can include materials similar to substrate 102. For example, each of buffer region 120 and channel region 122 can include a semiconductor material having lattice constant substantially closed to (e.g., lattice mismatch within 1%) that of substrate 102. In some embodiments, each of buffer region 120 and channel region 122 can include material similar to (e.g., lattice mismatch within 1%) or different from each other. In some embodiments, buffer region 120 can include an elementary semiconductor, such as silicon and germanium. In some embodiments, channel region 122 can include an alloy semiconductor, such as silicon germanium carbide, silicon germanium, gallium arsenic phosphide, gallium indium phosphide, gallium indium arsenide, gallium indium arsenic phosphide, aluminum indium arsenide, and aluminum gallium arsenide.

Each of buffer region 120 and channel region 122 can be p-type, n-type, or un-doped. In some embodiments, a portion of channel region 122 under gate structure 110 and another portion of channel region 122 horizontally (e.g., in the x-direction) outside gate structure 110 can have different doping type. For example, a portion of channel region 122 under gate structure 110 can be un-doped, and another portion of channel region 122 that is outside gate structure 110 can be n-type doped. In some embodiments, buffer region 120 and a portion of channel region 122 under gate structure can have same doping type.

Source-drain region 124 can include an epitaxially-grown semiconductor material. In some embodiments, the epitaxially-grown semiconductor material can be the same material as the material of substrate 102. In some embodiments, the epitaxially-grown semiconductor material can include a different material from the material of substrate 102. The epitaxially-grown semiconductor material can include: (i) a semiconductor material, such as germanium (Ge) and silicon (Si); (ii) a compound semiconductor material, such as gallium arsenide and aluminum gallium arsenide; or (iii) a semiconductor alloy, such as silicon germanium (SiGe) and gallium arsenide phosphide. In some embodiments, device 100A can include a FET 106 having a first source-drain region 124 (e.g., source-drain region 124A) and another FET 106 having a second source-drain region 124 (e.g., source-drain region 124B), where the first and the second source-drain regions 124 (e.g., 124A and 124B) can be made of the same or different semiconductor material.

Source-drain region 124 can be p-type or n-type doped. In some embodiments, source-drain region 124 can be doped with p-type dopants, such as boron, indium, gallium, zinc, beryllium, and magnesium. In some embodiments, source-drain region 124 can be doped with re-type dopants, such as phosphorus, arsenic, silicon, sulfur, and selenium. In some embodiments, each of n-type source-drain region 124 can have a plurality of n-type sub-regions. Except for the type of dopants, the plurality of n-type sub-regions can be similar to the respective plurality of p-type sub-regions, in thickness, relative Ge concentration with respect to Si, dopant concentration, and/or epitaxial growth process conditions.

Source-drain region 124 can be grown over channel regions 122 and/or buffer regions 120 via an epitaxial growth process. In some embodiments, source-drain regions 124 can be grown on portions of FETs 106 that are horizontally (e.g., in the x-direction) outside gate structures 110 via the epitaxial growth process. The epitaxial growth process for source-drain region 124 can include (i) chemical vapor deposition (CVD), such as low pressure CVD (LPCVD), rapid thermal chemical vapor deposition (RT-CVD), metal-organic chemical vapor deposition (MOCVD), atomic layer CVD (ALCVD), ultrahigh vacuum CVD (UHVCVD), reduced pressure CVD (RPCVD), or any suitable CVD; (ii) molecular beam epitaxy (MBE) processes; (iii) any suitable epitaxial process; or (iv) a combination thereof. In some embodiments, source-drain region 124 can be grown by an epitaxial deposition/partial etch process, which repeats the epitaxial deposition/partial etch process at least once. Such repeated deposition/partial etch process is also called a "cyclic deposition-etch (CDE) process." In some embodiments, source-drain region 124 can be grown by selective epitaxial growth (SEG), where an etching gas can be added to promote the selective growth of semiconductor material on the exposed surfaces of FET 106, but not on insulating material (e.g., dielectric material of STI regions 104).

Doping type of source-drain regions 124 can also be determined by introducing one or more precursors during the above-noted epitaxial growth process. For example, source-drain region 124 can be in-situ p-type doped during the epitaxial growth process using p-type doping precursors, such as diborane ($B_2H_6$) and boron trifluoride ($BF_3$). In some embodiments, source-drain region 124 can be in-situ n-type doped during an epitaxial growth process using n-type doping precursors, such as phosphine ($PH_3$) and arsine ($AsH_3$).

Isolation structure 108 can be a vertical structure formed over STI region 104 and placed horizontally (e.g., in the y-direction) between FETs 106. Isolation structure 108 can include a dielectric stack to electrically insulate multiple FETs 106 from one another. In some embodiments, isolation structure 108 can be a vertical extension of STI region 104 to electrically insulate portions of FETs 106. For example, isolation structure 108 can be a dielectric fin structure placed between two FETs 106 to isolate, for example, metal gates of the two FETs 106 from one another. In some embodiments, each of FETs 106 and each of isolation structures 108 can be alternatively and horizontally (e.g., in the y-direction) placed next to each other. In some embodiments, isolation structure 108 can be a fin structure to isolate source-drain regions 124 of the two FETs 106 from one another, Isolation structure 108 can have a vertical dimensions (e.g., height)

that is substantially equal to or greater than a height of channel region 122. In some embodiments, isolation structure 108 can have horizontal dimensions (e.g., width along the y-direction) that are substantially equal to or less than a spacing between two horizontally (e.g., in the y-direction) adjacent FETs 106.

As shown in FIG. 1A, gate structure 110 can be a vertical structure traversing along a y-axis and through one or more FETs 106. Although FIG. 1A shows two gate structures 110 traversing six FETs 106, any number of gate structures 110 can be included in device 100A, where each of the gate structures 110 can be parallel to each other and can traverse any number of FETs 106. In some embodiments, gate structure 110 can surround a portion of a top surface and a portion of side surfaces of channel region 122 (e.g., when device 100A is a collection of one or more FinFETs). In some embodiments, gate structure 110 can surround a portion of a top surface, a portion of side surfaces, and a portion of a bottom surface of channel region 122 (e.g., when device 100A is a collection of one or more nano-sheet FETs or a collection of one or more nano-wire FETs). Gate structure 110 can include a gate electrode 114 and a dielectric layer 112 disposed between the surrounded channel region 122 and gate electrode 114. In some embodiments, gate structure 110 can have a horizontal dimension (e.g., gate length) $L_g$ that ranges from about 5 nm to about 30 nm. In some embodiments, gate structure 110 can be formed by a gate replacement process. In some embodiments, gate structure 110 can be formed by a gate first process.

Dielectric layer 112 can be adjacent to and in contact with gate electrode 114. Dielectric layer 112 can have a thickness in a range from about 1 nm to about 5 nm. Dielectric layer 112 can include silicon oxide and may be formed by CVD, atomic layer deposition (ALD), physical vapor deposition (PVD), e-beam evaporation, or any other suitable process. In some embodiments, dielectric layer 112 can include (i) a layer of silicon oxide, silicon nitride, and/or silicon oxynitride, (ii) a high-k dielectric material, such as aluminum oxide ($Al_2O_3$), hafnium oxide ($HfO_2$), hafnium aluminum oxide ($HfAlO_x$), titanium oxide ($TiO_2$), hafnium zirconium oxide ($HfZrO_x$), tantalum oxide ($Ta_2O_3$), hafnium silicate ($HfSiO_4$), hafnium silicon oxide ($HfSiO_x$), zirconium oxide ($ZrO_2$), zirconium silicate ($ZrSiO_2$), (iii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iv) a combination thereof. High-k dielectric layers may be formed by ALD and/or other suitable methods. In some embodiments, dielectric layer 112 can include a single layer or a stack of insulating material layers. Based on the disclosure herein, other materials and formation methods for dielectric layer 112 are within the scope and spirit of this disclosure.

Gate electrode 114 can include a gate work function metal layer (not shown) and a gate metal fill layer (not shown), In some embodiments, the gate work function metal layer can be disposed on dielectric layer 112. The gate work function metal layer can include a single metal layer or a stack of metal layers. The stack of metal layers can include metals having work functions similar to or different from each other. In some embodiments, the gate work function metal layer can include, for example, aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and/or combinations thereof. The gate work function metal layer can be formed using a suitable process, such as ALD, CVD, PVD, plating, or combinations thereof. In some embodiments, the gate work function metal layer can have a thickness in a range from about 2 nm to about 15 nm. Based on the disclosure herein, other materials, formation methods, and thicknesses for the gate work function metal layer are within the scope and spirit of this disclosure.

The gate metal fill layer can include a single metal layer or a stack of metal layers. The stack of metal layers can include metals different from each other. In some embodiments, the gate metal fill layer can include a suitable conductive material, such as Ti, silver (Ag), Al, titanium aluminum nitride (TiAlN), tantalum carbide (TaC), tantalum carbonitride (TaCN), tantalum silicon nitride (TaSiN), manganese (Mn), zirconium (Zr), titanium nitride (TiN), tantalum nitride (TaN), ruthenium (Ru), molybdenum (Mo), tungsten nitride (WN), copper (Cu), tungsten (W), cobalt (Co), nickel (Ni), titanium carbide (TiC), titanium aluminum carbide (TiAlC), tantalum aluminum carbide (TaAlC), metal alloys, and/or combinations thereof. The gate metal fill layer can be formed by ALD, PVD, CVD, or other suitable deposition process. Based on the disclosure herein, other materials and formation methods for the gate metal fill layer are within the scope and spirit of this disclosure.

ILD structure 130 can include one or more insulating layers to provide electrical isolation to structural elements it surrounds or covers—for example, gate structure 110, source-drain regions 124, and source/drain contact structures (not shown in FIG. 1A; shown in FIGS. 1B, 2F and 2G) that will be formed adjacent to the gate structures. Each of the insulating layers can include an insulating material, such as silicon oxide, silicon dioxide ($SiO_2$), silicon oxycarbide (SiOC), silicon oxynitride (SiON), silicon oxy-carbon nitride (SiOCN), or silicon carbonitride (SiCN) that can be formed by low pressure chemical vapor deposition (LPCVD), plasma enhanced chemical vapor deposition (PECVD), chemical vapor deposition (CVD), flowable CVD (FCVD), or high-aspect-ratio process (HARP). ILD structure 130 can have a thickness (e.g., along the z-direction) in a range from about 50 nm to about 200 nm. Based on the disclosure herein, other insulating materials, thicknesses, and formation methods for ILD structure 130 are within the scope and spirit of this disclosure.

Figure 1B:
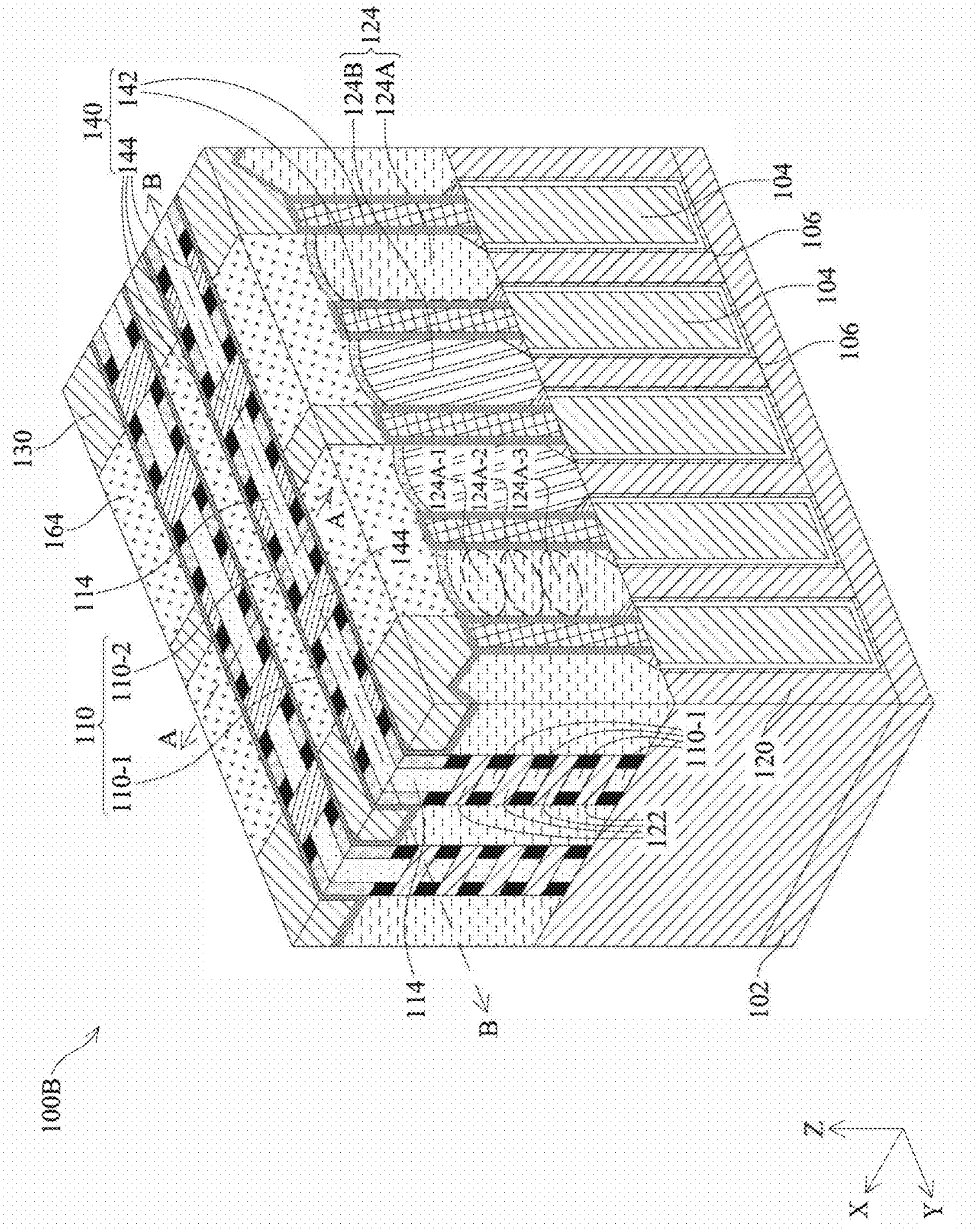
FIG. 1B is an isometric view of a semiconductor device, according to some embodiments.

FIG. 1B is an isometric view of a device 100B, according to some embodiments. Device 100B can be a collection of one or more FinFETs, a collection of one or more nano-sheet FETs, a collection of one or more nano-wire FETs, or collection of one or more of any other type of FETs. Device 100B can include multiple STI regions 104, one or more FETs 106, multiple gate structures 110, multiple source/drain (S/D) contact structures 164 configured as metal-contacts of source-drain region 124, and multiple isolation structures 140. The discussion of elements with the same annotations in FIGS. 1A-1B applies to each other unless mentioned otherwise. Although FIGS. 1A-1B illustrate different numbers of channel layers within channel region 122, the number of channel layers within channel region 122 can be the same for FIGS. 1A-1B.

The discussion of isolation structure 108 applies to isolation structure 140 unless mentioned otherwise. Isolation structures 140 can include a dielectric stack 142 formed over STI region 104 and horizontally (e.g., in the y-direction)

between two FETs 106. A top surface of dielectric stack 142 can be below to a top surface of gate electrode 114. In some embodiments, the top surface of dielectric stack 142 can be substantially coplanar with a top surface of FET 106. Dielectric stack 142 can include one or more insulating layers made of any suitable insulating material, such as a silicon oxide, silicon nitride, silicon oxynitride, FSG, any other low-k dielectric material, or a high-k material.

In some embodiments, isolation structure 140 can further include an insulating block 144 formed over dielectric stack 142. A top surface of insulating block 144 can be above the top surface of gate electrode 114. In some embodiments, insulating block 144 can be formed horizontally (e.g., in the y-direction) between two segments of gate structures 110 (e.g., gate structure segments 110-1 and 110-2) and can be configured to break connection of gate electrodes 114 of the two segments of gate structures 110. For example, the top surface of insulating block 144 can be above top surfaces of gate electrodes 114 of gate structure segments 110-1 and 110-2, such that gate electrodes 114 of gate structure segment 110-1 can be electrically insulated from that of gate structure 110-2. Insulating block 144 can include one or more insulating layers, where a topmost layer of the one or more insulating layer can be made of a high-k dielectric material, such as aluminum oxide ($Al_2O_3$), hafnium oxide ($HfO_2$), zirconium oxide ($ZrO_2$), hafnium aluminum oxide ($HfAlO_x$), hafnium silicon oxide (HfSiO), or any other suitable high-k material. Each of the one or more insulating layers under the topmost layer can be made of any suitable insulating material such as a high-k dielectric material or a low-k dielectric material.

In some embodiments, in referring to FIG. 1B, source-drain region 124 can have multiple sub-regions (e.g., sub-regions 124A-1, 124A-2, and 124A-3) that can include SiGe and can differ from each other based on, for example, doping concentration, epitaxial growth process conditions, and/or relative concentration of Ge with respect to Si. Although FIG. 1B indicates three sub-regions in source-drain region 124, any number of sub-regions can be included in source-drain region 124. In some embodiments, each of the sub-regions may have thicknesses similar to or different from each other and thicknesses that can range from about 0.5 nm to about 5 nm. In some embodiments, the atomic percent Ge in sub-regions closest to substrate 102 (e.g., sub-region 124A-3) can be smaller than that in sub-regions farthest from substrate 102 (e.g., sub-region 124A-1). In some embodiments, the sub-regions closest to the top surface of PET 106 (e.g., sub-region 124A-1) can include Ge in a range from about 15 atomic percent to about 35 atomic percent, while the sub-regions farthest from the top surface of PET 106 (e.g., sub-region 124A-3) can include Ge in a range from about 25 atomic percent to about 50 atomic percent with any remaining atomic percent being Si in the sub-regions.

The multiple sub-regions of source-drain regions 124 can be epitaxially grown under a pressure from about 10 Torr to about 300 Torr and at a temperature from about 500° C. to about 700° C. using reaction gases, such as an etching agent, $GeH_4$ as Ge precursor, dichlorosilane (DCS) and/or $SiH_4$ as Si precursor, $H_2$, and/or $N_2$. To achieve different concentrations of Ge in the multiple sub-regions, the ratio of a flow rate of Ge to Si precursors can be varied during their respective growth process, according to some embodiments. For example, a Ge to Si precursor flow rate ratio in a range from about 9 to about 25 can be used during the epitaxial growth of the sub-regions closest to the top surface of FET 106, while a Ge to Si precursor flow rate ratio less than about 6 can be used during the epitaxial growth of the sub-regions farthest from the top surface of PET 106.

The multiple sub-regions of source-drain regions 124 can have varying dopant concentrations with respect to each other, according to some embodiments. For example, the sub-regions closest to substrate 102 can be undoped or can have a dopant concentration dopant concentration less than about $8\times10^{20}$ atoms/cm$^3$) less than that of the sub-regions farthest from substrate 102 (e.g., dopant concentration in a range from about $8\times10^{20}$ to about $3\times10^{22}$ atoms/cm$^3$). Other materials, thicknesses, Ge concentrations, and dopant concentrations for the above-noted sub-regions (e.g., sub-regions 124A-1, 124A-2, and 124A-3) of source-drain regions 124 are within the scope and spirit of this disclosure.

Device 100B is further described with reference to FIGS. 2A-2G. The discussion of elements with the same annotations in FIGS. 1A-1B and 2A-2G applies to each other unless mentioned otherwise. Although FIG. 1B, FIGS. 2A-2F, and FIG. 2G illustrate different numbers of gate structures 110 and different numbers of channel layers within channel region 122, the number of gate structures 110 and the number of channel layers within channel region 122 can be the same as each other. FIGS. 2A and 2D-2G show cross-sectional views along line A-A of device 100B of FIG. 1B, according to some embodiments. FIG. 2B shows a cross-sectional view along line B-B of device 100B of FIG. 1B, according to some embodiments. FIG. 2C shows cross-sectional views both along line A-A and line B-B of device 100B of FIG. 1B, according to some embodiments. The cross-sectional shapes of STI regions 104, buffer regions 120, channel regions 122, source-drain regions 124, isolation structures 140, gate structures 110, and ILD structures 130 shown in FIGS. 2A-2G are illustrative and are not intended to be limiting.

Figure 2A:
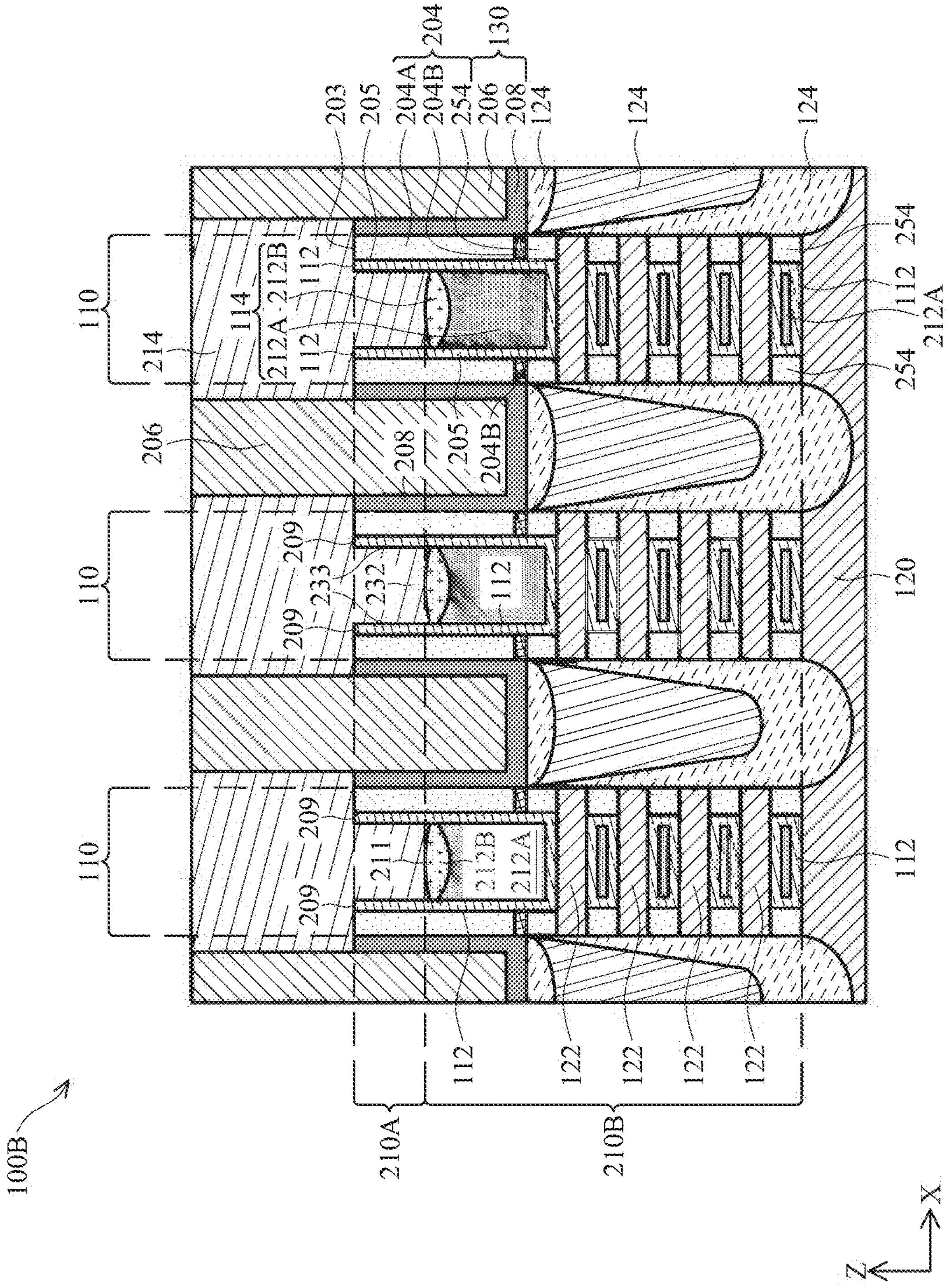
FIGS. 2A-2G are cross-sectional views of various semiconductor devices, according to some embodiments.
Figure 2B:
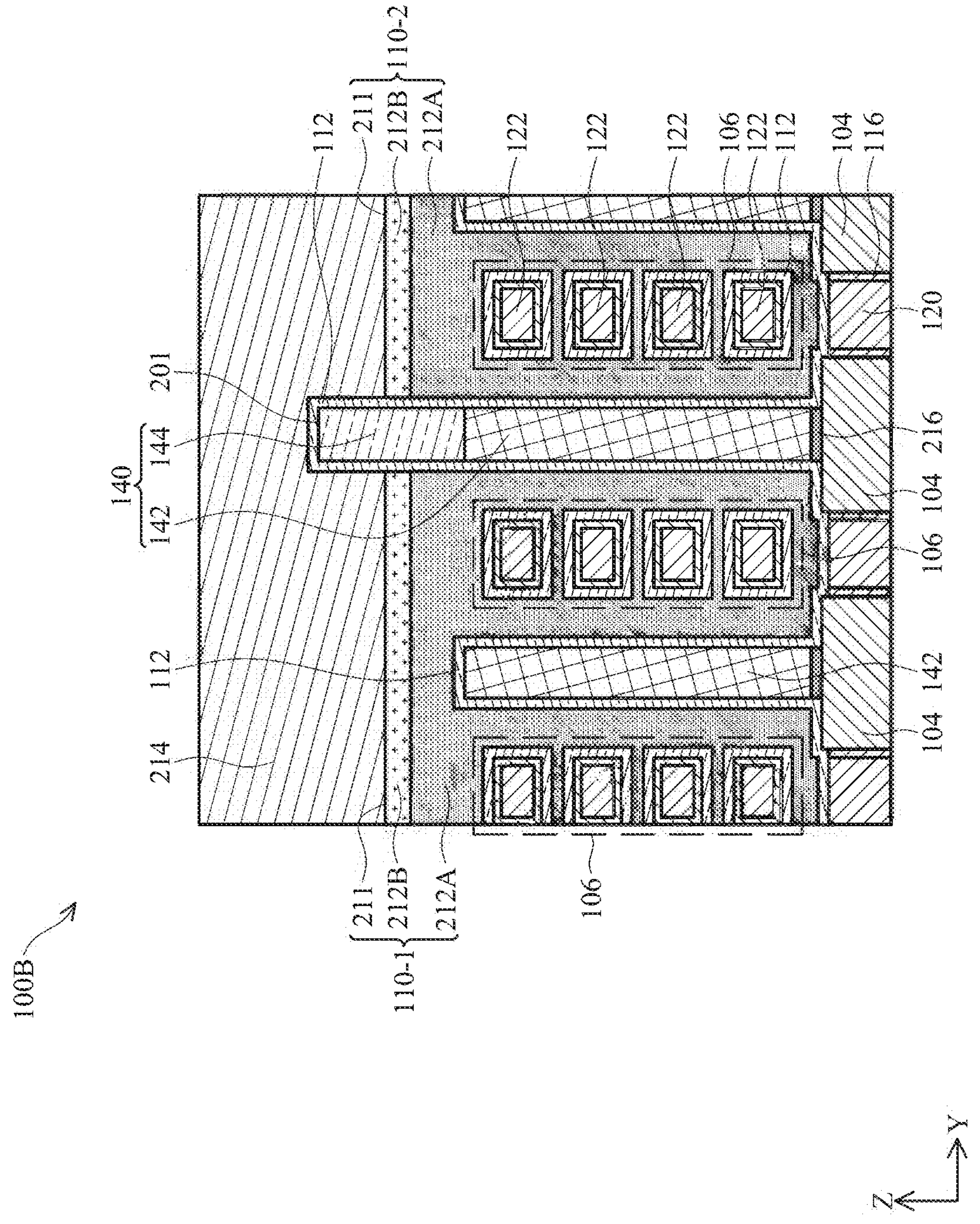
Figure 2C:
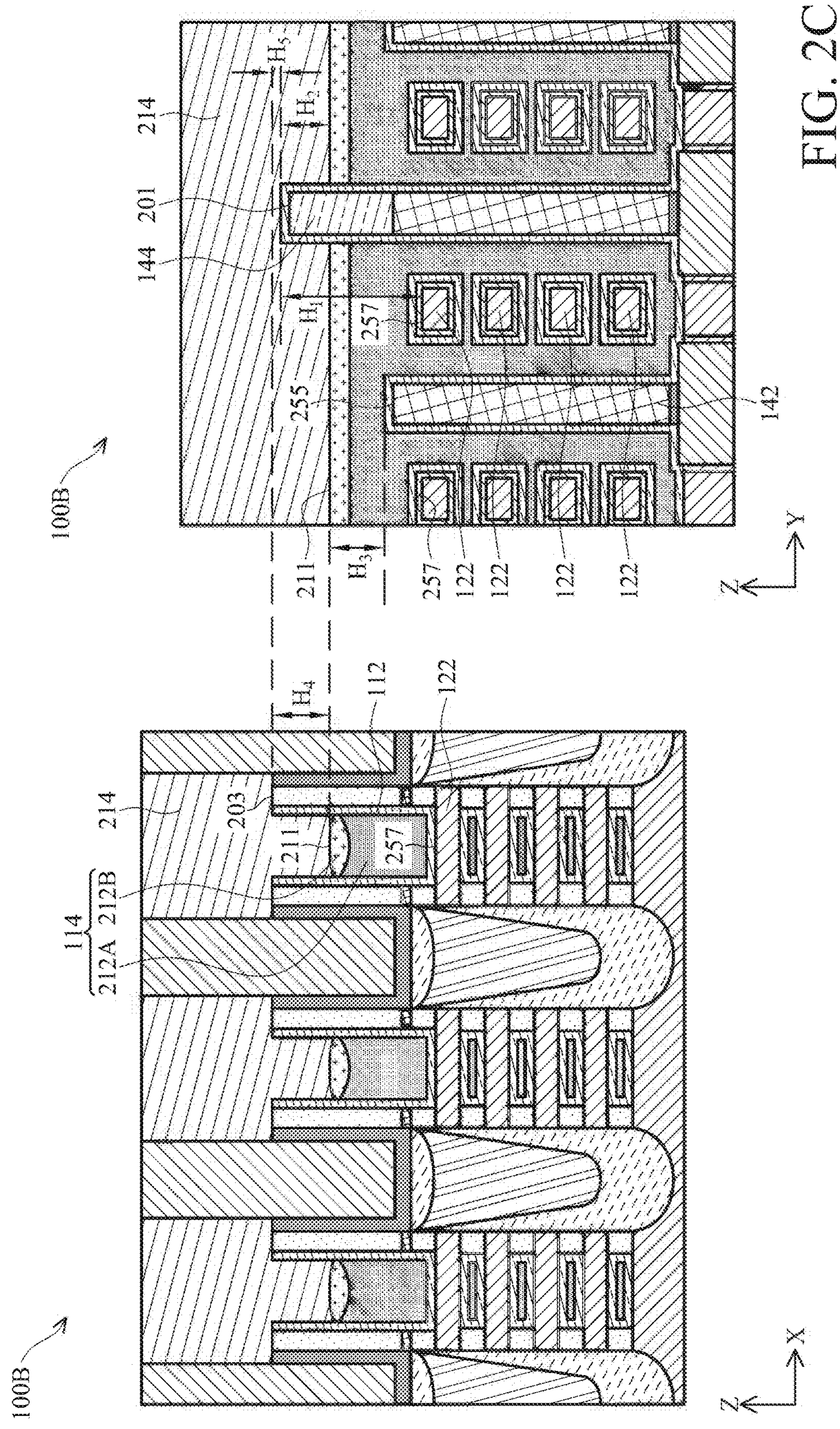

As shown in FIG. 2A, each ILD structure 130 can include a contact etch stop layer (CESL) 208 and an insulating layer 206 disposed over CESL 208, according to some embodiments. CESL 208 can be configured to protect gate structure 110 and/or portions of source-drain regions 124 that are not in contact with S/D contact structures 164 (not shown in FIG. 2A; shown in FIG. 1B); this protection can be provided, for example, during formation of insulating layer 206 and/or S/D contact structures 164.

CESL 208 can be disposed over sides of gate structure 110. In some embodiments, CESL 208 can include, for example, silicon nitride ($SiN_x$), silicon oxide ($SiO_x$), silicon oxynitride (SiON), silicon carbide (SiC), silicon carbonitride (SiCN), boron nitride (BN), silicon boron nitride (SiBN), silicon carbon boron nitride (SiCBN), or a combination thereof. In some embodiments, CESL 208 can include silicon nitride or silicon oxide formed by low pressure chemical vapor deposition (LPCVD), plasma enhanced chemical vapor deposition (PECVD), chemical vapor deposition (CVD), or silicon oxide formed by a high-aspect-ratio process (HARP). In some embodiments, CESL 208 can have a thickness in a range from about 3 nm to 10 nm or from about 10 nm to about 30 nm. Based on the disclosure herein, other materials, formation methods, and thicknesses for CESL 208 are within the scope and spirit of this disclosure.

Insulating layer 206 can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide may be deposited using flowable CVD (FCVD). In some embodiments, the dielectric material can be silicon oxide. In some embodiments, insulating layer 206 can have a thickness in a range from about 50 nm to about 200 nm. Based on the disclosure herein, other materials, thicknesses, and formation methods for insulating layer 206 are within the scope and spirit of this disclosure.

In referring to FIG. 2A, each gate structure 110 can include dielectric layer 112, gate electrode 114, and a spacer structure 204. Dielectric layer 112 can be disposed over a top portion and side portions (not shown in FIG. 2A) of channel region 122. In some embodiments, dielectric layer 112 can also be disposed over a bottom portion of channel region 122. Dielectric layer 112 can form a recess structure 232 over channel region 122 and can include top surfaces 209 and two opposing side surfaces 233. In some embodiments, dielectric layer 112 can contact a portion of at least one channel layer within channel region 122, where dielectric layer 112's recess structure 232 can be formed over channel region 122's top surface.

Gate electrode 114 can be in contact with dielectric layer 112. For example, gate electrode 114 can be formed in recess structure 232 to contact a portion of side surfaces 233, where a top surface 211 of gate electrode 114 can be below top surfaces 209. Furthermore, gate electrode 114 can be formed over other portions of dielectric layer 112. For example, gate electrode 114 can be formed over a portion of dielectric layer 112 that surrounds or wraps a portion of channel region 122. In other words, gate electrode 114 can be in contact with a lower portion 210B of dielectric layer 112, while an upper portion 210A of dielectric layer 112 that is not in contact with gate electrode 114 can be positioned above gate electrode 114's top surface 211. In some embodiments, gate electrode 114 can include a lower electrode 212A and an upper electrode 212B formed over lower electrode 212A. Lower electrode 212A can function as a gate work function metal layer and/or a gate metal fill layer and can be placed adjacent (and/or between) each channel layer of channel region 122. Upper electrode 212B can provide a low resistance interface between lower electrode 212A and an interconnect structure (not shown in FIGS. 2A-2E; shown in FIGS. 2F and 2G) electrically coupled to gate electrode 114.

Spacer structure 204 can form sidewalls of gate structure 110 and can be in contact with dielectric layer 112 and/or gate electrode 114. Spacer structure 204 can electrically insulate gate electrode 114 from source-drain region 124 and/or S/D contact structures 164 (shown in FIG. 1B). For example, as shown in FIG. 2A, spacer structure 204 can include a side surface 205 in contact with dielectric layer 112 and/or gate electrode 114, while an opposite side surface of spacer structure 204 can be in contact with ILD structure 130, source-drain region 124, or the S/D contact structures 164 (not shown in FIG. 2A; shown in FIG. 1B). Furthermore, spacer structure 204 can include a top surface 203 positioned above gate electrode 114's top surface 211. Spacer structure 204 can be made of an insulating material, such as a low-k material with a dielectric constant less than 3.9 (e.g., less than 3.5, 3.0, or 2.8). For example, spacer structure 204 can be made of silicon oxide, silicon nitride, or a combination thereof. In some embodiments, spacer structure 204 can include a multilayer structure. For example, spacer structure 204 can include an inner spacer 254 in contact with portions of dielectric layer 112 that surrounds or wraps a portion of channel region 122. In some embodiments, inner spacer 254 can be in contact with source-drain region 124. Spacer structure 204 can further include a spacer layer 204B disposed over a top of inner spacers 254 and a spacer layer 204A disposed over spacer layer 204B, In some embodiments, spacer layers 204A and 204B can be in contact with ILD structure 130. In some embodiments, each of inner spacer 254 and spacer layers 204A-204B can have a thickness ranging from about 7 nm to about 10 nm. Based on the disclosure herein, other materials and thicknesses for spacer structure 204 are within the scope and spirit of this disclosure.

In some embodiments, dielectric layer 112 can be configured to protect spacer structure 204 during a formation of the interconnect structure. For example, dielectric layer 112 can cover spacer structure 204's side surfaces 205, thus protecting spacer structure 204 from being compromised during the formation of the interconnect structure.

In some embodiments, gate structure 110 can further include a padding layer 214 disposed over spacer structure 204, dielectric layer 112, and gate electrode 114. For example, padding layer 214 can be disposed into recess structure 232 to cover dielectric layer 112's upper portion 210A and gate electrode 114's top surface 211, Padding layer 214 can further cover spacer structure 204's top surface 203. In some embodiments, padding layer 214 can be in contact with ILD structure 130. Padding layer 214 can be made of any suitable insulating material, such as a low-k dielectric material.

FIG. 2B shows a cross-sectional view device 100B through multiple FETs 106 and multiple isolation strictures 140 under gate structure 110 (line B-B of FIG. 1B). As shown in FIG. 2B, each isolation structure 140 (e.g., dielectric stack 142 and/or insulating block 144) can be placed vertically (e.g., in the z-direction) above STI region 104 and laterally (e.g., in the y-direction) between two FETs 106, In some embodiments, each isolation structure 140 can include a liner 216 disposed between STI region 104 and dielectric stack 142, where liner 216 can be made of any suitable insulating material. In some embodiments, isolation structure 140 can further include insulating block 144 to divide gate structure 110 into multiple segments (e.g., gate structure segments 110-1 and 110-2), In other words, a top surface 201 of insulating block 144 can be positioned above top surface 211 of gate electrode 114. Therefore, insulating block 144 can isolate gate structure segments 110-1 and 110-2 from each other (e.g., isolate gate structure segments' lower electrodes 212A from each other; isolate gate structure segments' upper electrodes 212B from each other). In some embodiments, top surface 201 can be isolation structure 140's top surface.

FIG. 2C illustrates dimensions of various elements in FIGS. 2A and 2B. As shown in FIG. 2C, isolation structure 140's top surface 201 can be above channel region 122's top surface 257. In some embodiments, isolation structure 140's top surface 201 and channel region 122's top surface 257 can have a vertical height difference $H_1$ ranging from about 10 nm to about 50 nm. Isolation structure 140's top surface 201 can be above gate electrode 114's top surface 211. In some embodiments, isolation structure 140's top surface 201 and gate electrode 114's top surface 211 can have a vertical height difference $H_2$ less than about 40 nm or from about 4 nm to about 30 nm. Gate electrode 114's top surface 211 can be above dielectric stack 142's top surface 255. In some embodiments, gate electrode 114's top surface 211 and dielectric stack 142's top surface 255 can have a vertical height difference $H_3$ ranging from about 4 nm to about 30 nm. In some embodiments, dielectric stack 142's top surface 255 can be substantially coplanar with channel region 122's top surface 257. Spacer structure 204's top surface 203 can be above gate electrode 114's top surface 211. In some embodiments, spacer structure 204's top surface 203 and gate electrode 114's top surface 211 can have a vertical height difference $H_4$ less than about 50 nm. Spacer structure 204's top surface 203 can be substantially coplanar with or above isolation structure 140's top surface 201. In some embodiments, spacer structure 204's top surface 203 and isolation structure 140's top surface 201 can have a vertical height difference $H_5$ greater than or equal to about 1 nm or greater than or equal to about 10 nm.

Figure 2D:
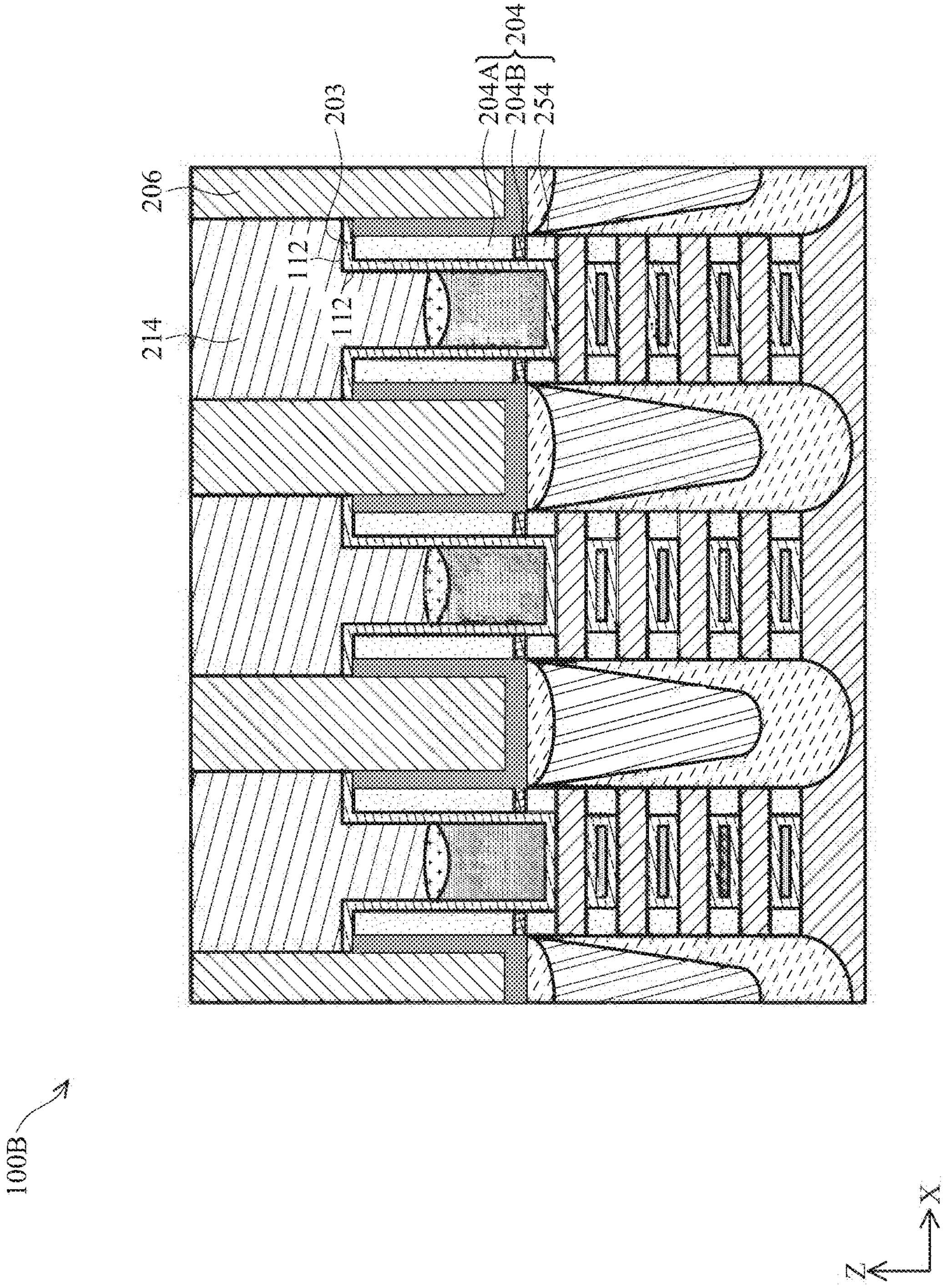
Figure 2E:
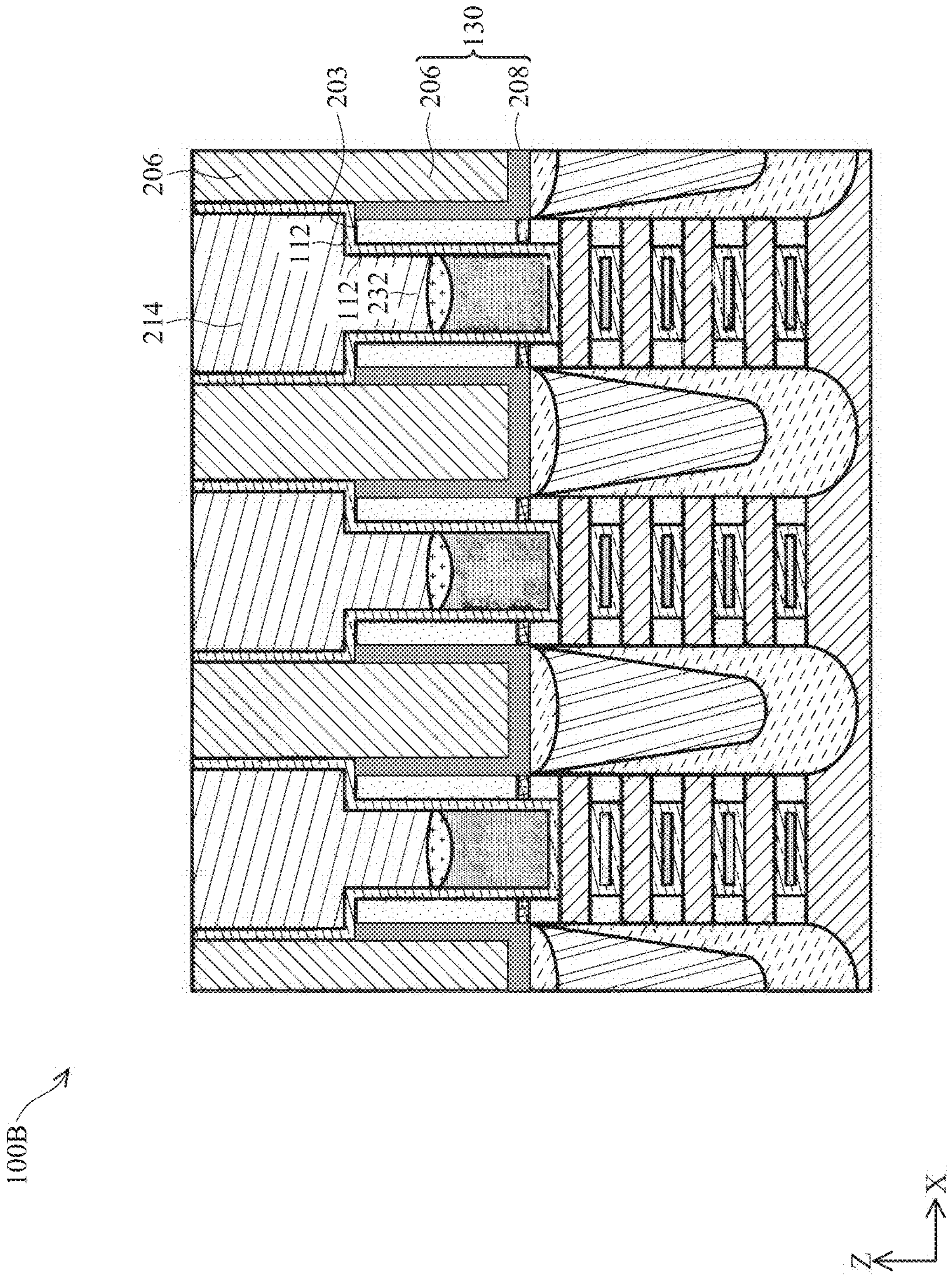

In some embodiments, as shown in FIG. 2D, dielectric layer 112 can be further disposed over spacer structure 204's top surface 203 to protect spacer structure 204 from being damaged during the formation of the interconnect structure. In some embodiments, dielectric layer 112 can be further configured to protect padding layer 214 during a formation of S/D contact structures 164 (shown in FIG. 1B). For examples, as shown in FIG. 2E, dielectric layer 112 can also be disposed over a portion of side surfaces of ILD structures 130 that are positioned above spacer structure 204's top surface 203. In this way, dielectric layer 112 can encapsulate padding layer 214's sides, thus protecting padding layer 214 from being damaged during the formation S/D contact structure 164. In some embodiments, dielectric layer 112 can disposed between padding layer 214 and ILD structures 130, and/or between padding layer 214 and spacer structure 204 to encapsulate padding layer 214's sides.

Figure 2F:
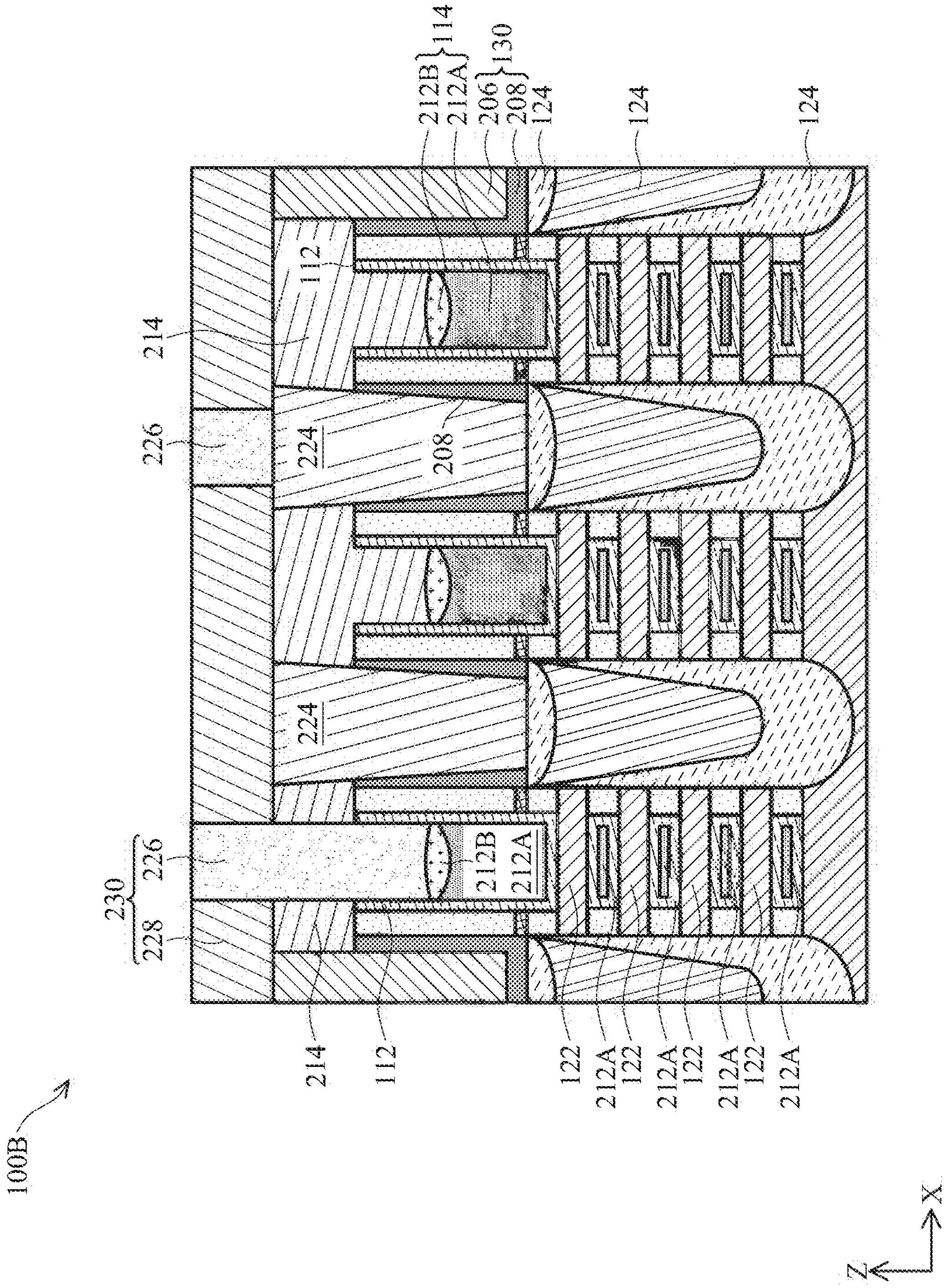

In some embodiments, in referring to FIG. 2F, device 100B can include S/D contact structures 224 formed within ILD structures 130 and in contact with underlying source-drain regions 124. S/D contact structure 224 can be an embodiment of S/D contact structure 164. S/D contact structure 224 can be configured to electrically connect the underlying source-drain region 124 to other elements of the integrated circuit (not shown in FIGS. 2F and 2G). S/D contact structure 224 can include a silicide layer and a conductive region over the silicide layer (not shown in FIGS. 2F and 26). The silicide layer can include metal silicide and can provide a low resistance interface between the conductive regions and the underlying source-drain region 124. Examples of metal used for forming the metal silicide are Co, Ti, and Ni. The conductive region can include conductive materials, such as W, Al, and Co. The conductive region can have an average horizontal dimension (e.g., width in the x-direction) in a range from about 15 nm to about 25 nm and can have an average vertical dimension (e.g., height in the z-direction) in a range from about 400 nm to about 600 nm. In some embodiments, at least one conductive liner (not shown) can be disposed between the silicide layer and the conductive region. The conductive liner can be configured as a diffusion barrier and can include a single layer or a stack of conductive materials, such as TiN, Ti, Ni, TaN, Ta, or a combination thereof. In some embodiments, the conductive liner can act as an adhesion-promoting-layer, a glue-layer, a primer-layer, a protective-layer, and/or a nucleation-layer. The conductive liner can have a thickness in a range from about 1 nm to about 2 nm, according to some embodiments, Based on the disclosure herein, other materials and dimensions for the conductive liner, the silicide layer, and the conductive region are within the scope and spirit of this disclosure.

In some embodiments, device 100B can further include an interconnect structure 230 formed over gate structure 110 and S/D contact structure 224. Interconnect structure 230 can be configured to connect underlying gate structure 110 and underlying S/D contact structure 224 to other elements of the integrated circuit (not shown in FIGS. 2F and 26). Interconnect structure 230 can include a middle end of line (MEOL) insulating layer 228 and a trench conductor 226 embedded in MEOL insulating layer 228. MEOL insulating layer 228 can be formed over a portion of ILD structure 130, a portion of padding layer 214, and/or a portion of S/D contact structure 224. MEOL insulating layer 228 can be made of any suitable insulating material, such as a low-k dielectric material. Trench conductor 226 can be in contact with gate electrodes 114 of underlying gate structure 110 and/or underlying S/D contact structure 224. Trench conductor 226 can be made of conductive materials, such as W, Al, Cu, and Co. In some embodiments, Trench conductor 226 can further include barrier liner (not shown) configured as a diffusion barrier, where the barrier liner can include a single layer or a stack of conductive materials, such as TiN, Ti, Ni, TaN, Ta, or a combination thereof. MEOL insulating layer 228 can have an average vertical dimension (e.g., height in the z-direction) in a range from about 30 nm to about 600 nm. Trench conductor 226 can have an average horizontal dimension width in the x-direction) in a range from about 15 nm to about 25 nm and can have an average vertical dimension (e.g., height in the z-direction) in a range from about 400 nm to about 600 nm. The barrier liner can have a thickness in a range from about 1 nm to about 2 nm, according to some embodiments. Based on the disclosure herein other materials and dimensions for MEOL insulating layer 228, trench conductor 226, and the barrier liner are within the scope and spirit of this disclosure.

Figure 2G:
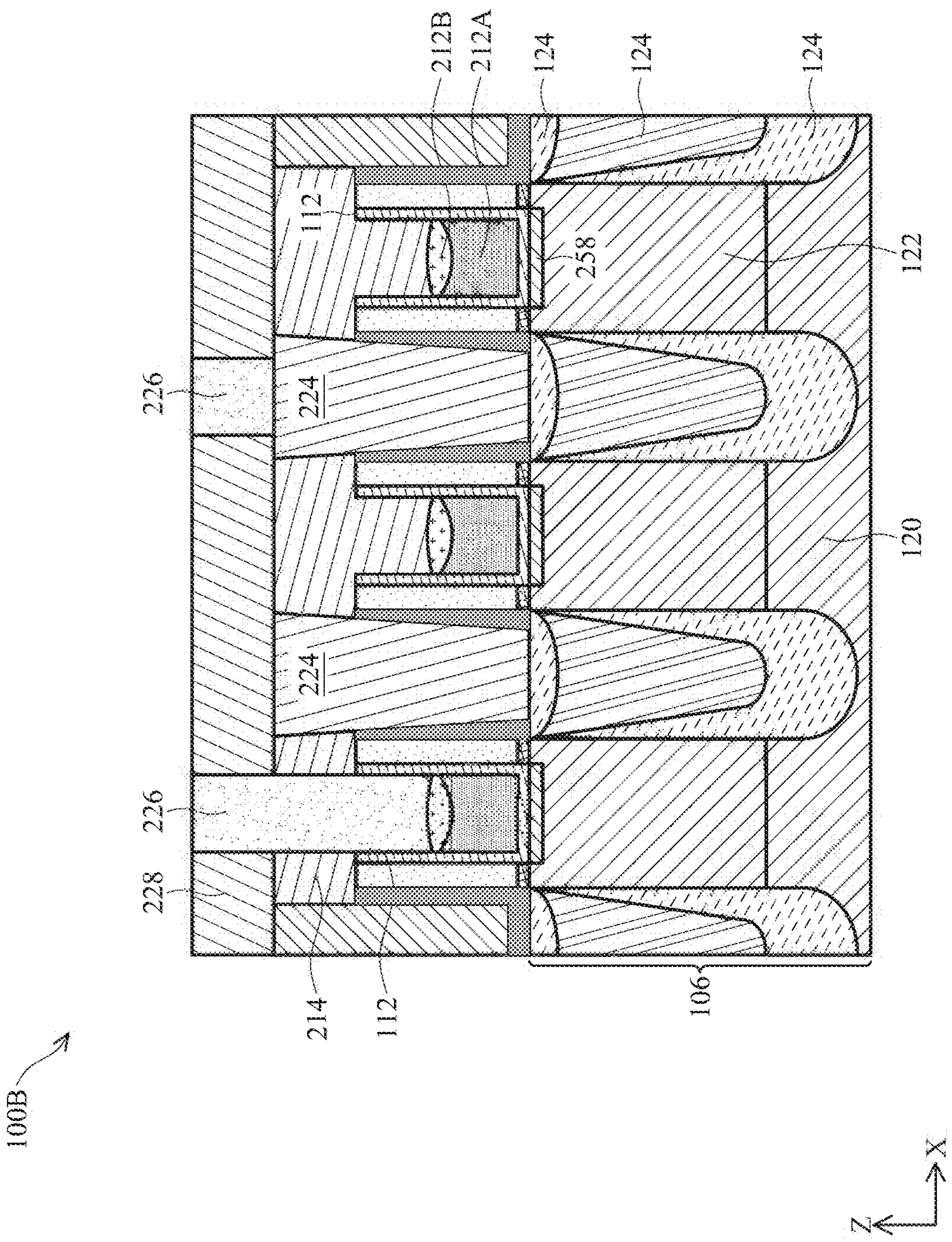

In some embodiments, in referring to FIG. 2G, device 100B can be a collection of one or more FinFETs, where a bottom of channel region 122 can be in contact with buffer region 120. In some embodiments, gate structure 110 can further include a dielectric layer 258 disposed over channel region 122. Dielectric layer 258 can also be disposed between STI regions 104 (not shown in FIG. 2G). In some embodiments, dielectric layer 258 can be sandwiched between channel region 122 and dielectric layer 112. Dielectric layer 258 can have a composition similar to dielectric layer 112. In some embodiments, dielectric layers 112 and 258 can function as gate dielectric layers of gate structure 110. In some embodiments, dielectric layer 258 can have a thickness thinner than or equal to that of dielectric layer 112.

Figure 3:
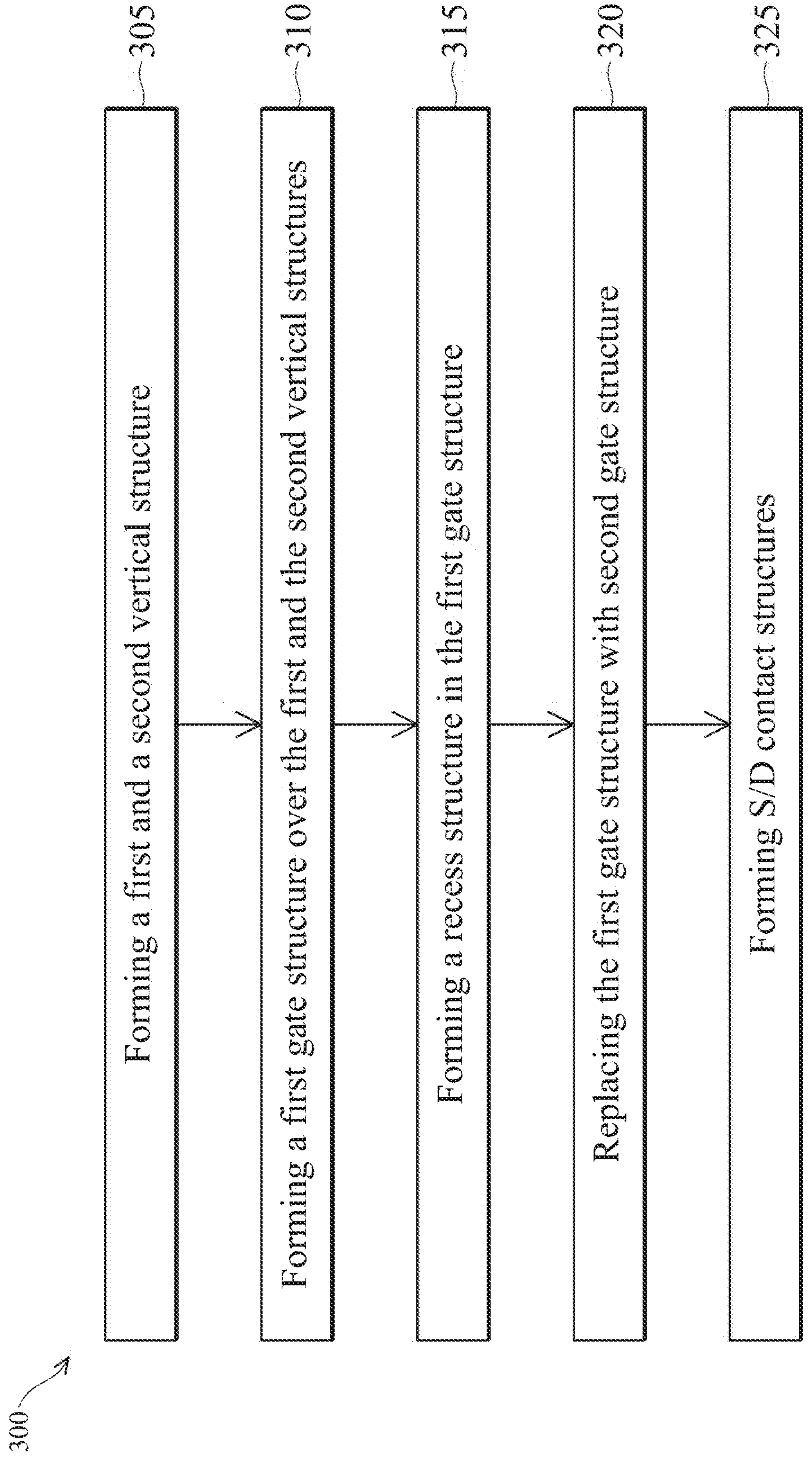
FIG. 3 is flow diagram of a method for fabricating a semiconductor device, according to some embodiments.

FIG. 3 is a flow diagram of a method 300 for fabricating device 1008 as described with reference to FIGS. 1B and 2A-2G, according to some embodiments. For illustrative purposes, the operations illustrated in FIG. 3 will be described with reference to the example fabrication process for fabricating device 100B as illustrated in FIGS. 4-27, which are isometric or cross-sectional views of device 100B at various stages of its fabrication, according to some embodiments. Operations can be performed in a different order or not performed depending on specific applications. It should be noted that method 300 does not manufacture a complete device 100B. Accordingly, it is understood that additional processes may be provided before, during, and after method 300, and that some other processes may only be briefly described herein. Elements in FIGS. 4-27 with the same annotations as elements in FIGS. 1A-1B and 2A-2G are described above.

Figure 4:
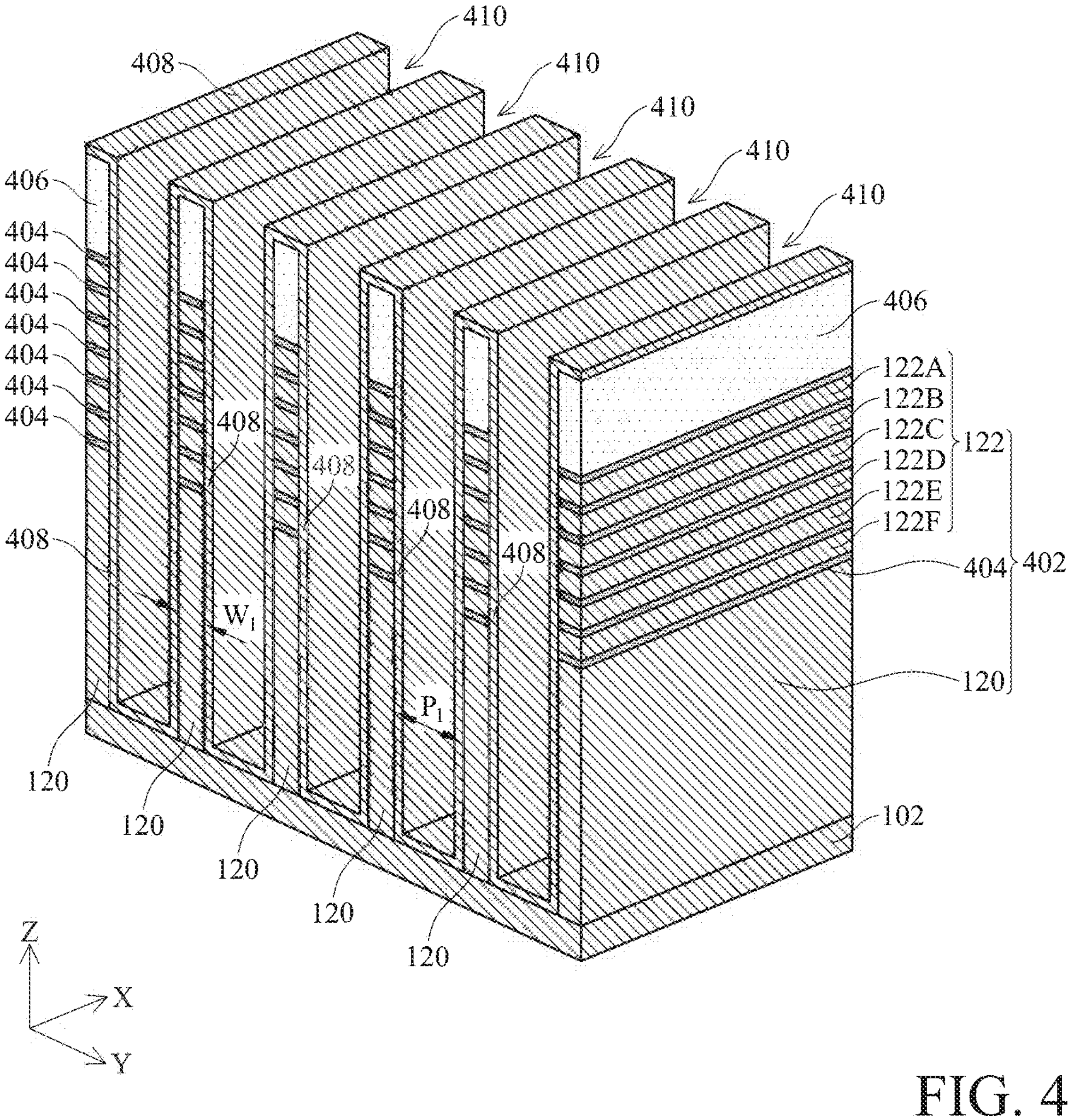
FIGS. 4-26 are isometric views of a semiconductor device at various stages of its fabrication process, according to some embodiments.
Figure 8:
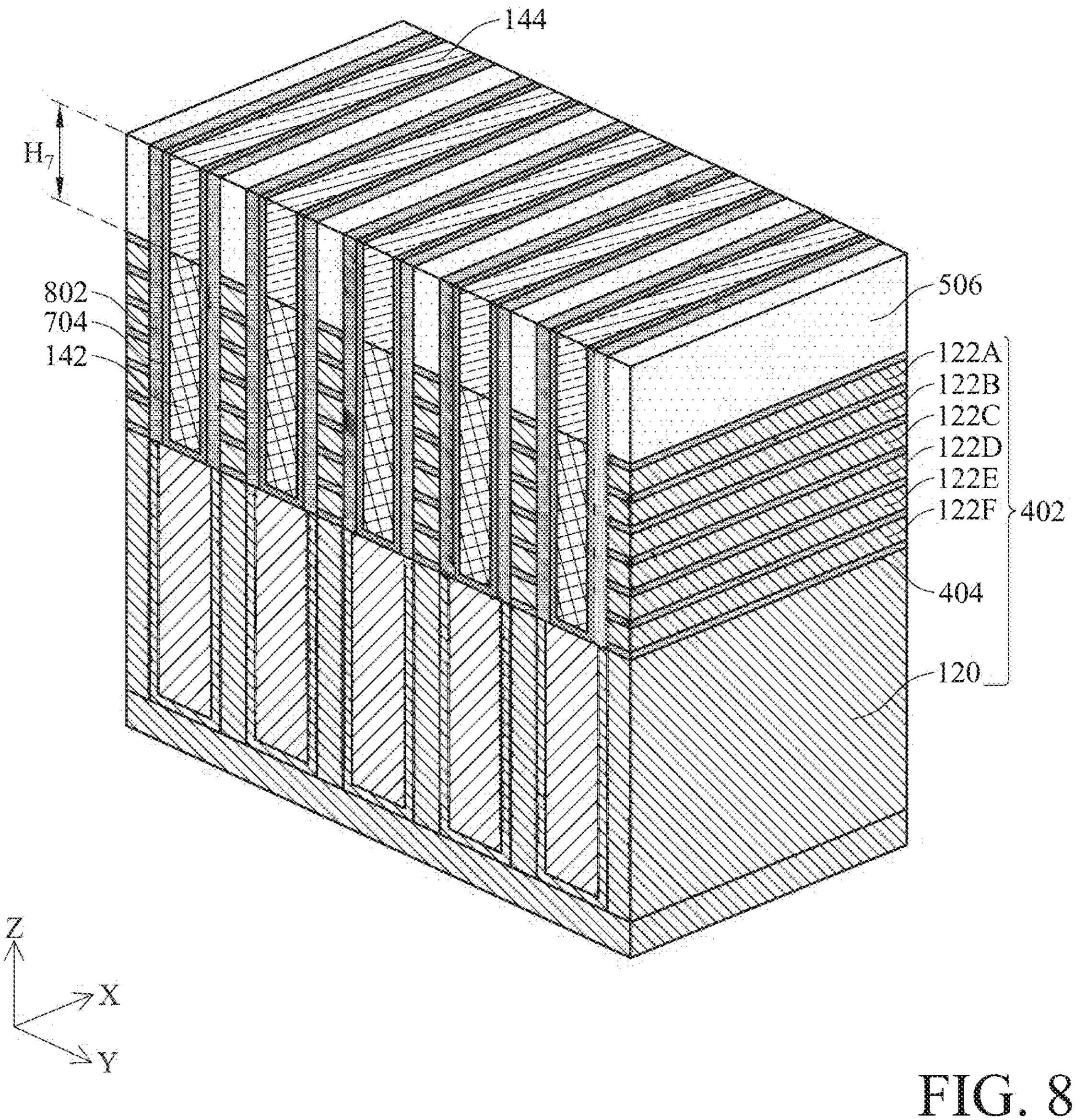
Figure 9:
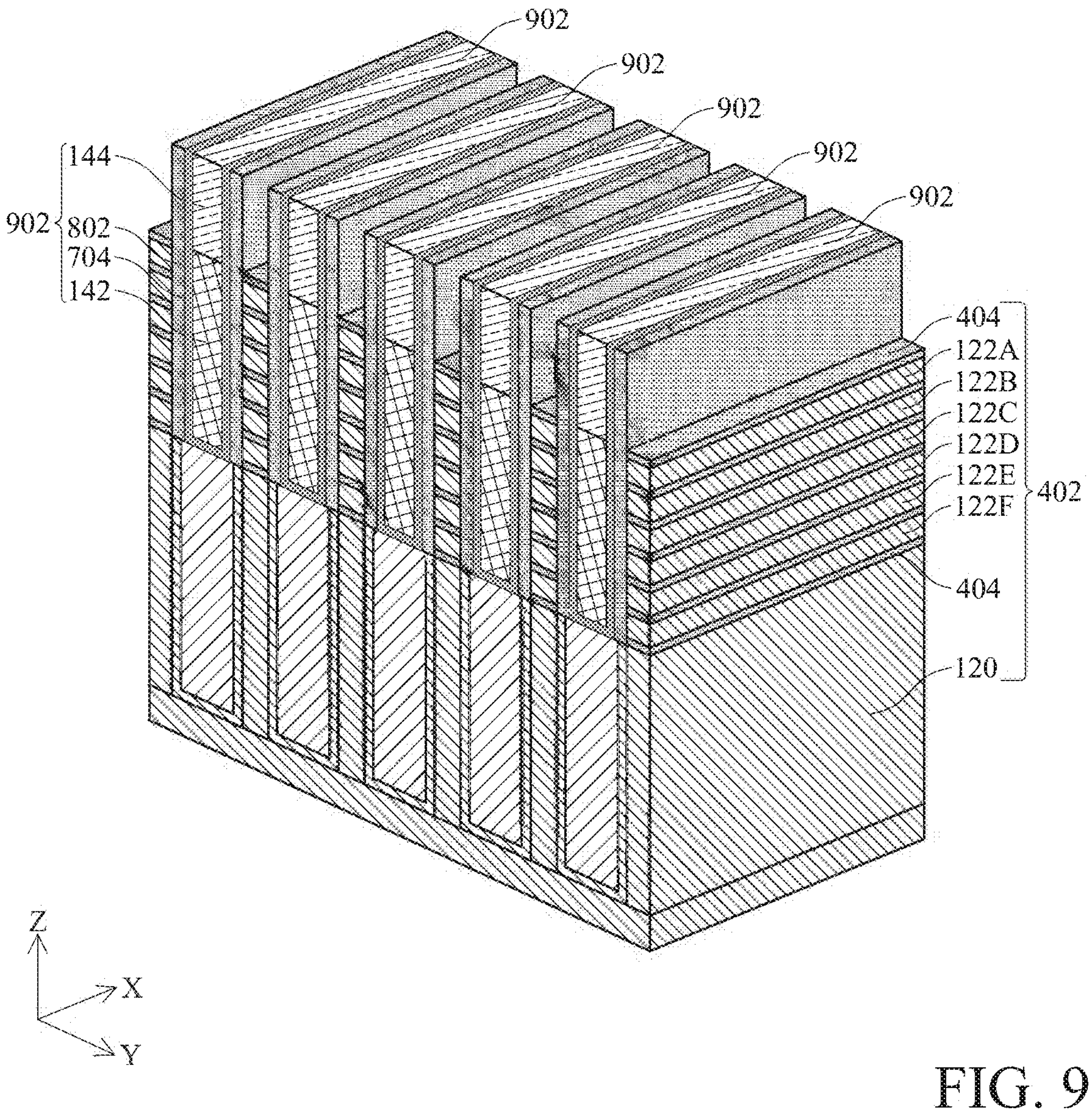

In operation 305, a first and a second vertical structure are formed on a substrate. For example, as shown in FIG. 9, multiple vertical structures 402 and multiple vertical structures 902 can be respectively formed on substrate 102. FIGS. 4-9 are isometric views of partially fabricated structures that can be used to describe the fabrication stages of operation 305. As shown in FIG. 4, the process of forming vertical structures 402 can include forming a patterned hard mask layer 406 over substrate 102 and forming recess structures 410 within substrate 102 via an etching process using patterned hard mask layer 406. The process of forming patterned hard mask layer 406 can include patterning a blanket film using a lithography process and/or an etching process. By way of example and not limitation, the blanket film can be silicon nitride, silicon carbon nitride, silicon oxide, or any other suitable material, and can be deposited using, LPCVD, RTCVD, ALD, or PECVD. The etching process for forming recess structures 410 can be a dry etch process, a wet etch process, or a combination thereof. In some embodiments, the dry etch process can use reactive ion etching using a chlorine or fluorine based etchant. Each vertical structure 402 can include buffer region 120 made of same or similar material as substrate 102. In some embodiments, vertical structure 402 can have a width $W_1$ ranging from about 3 nm to about 50 nm. In some embodiments, vertical structure 402 can have a width $W_1$ ranging from about 5 nm to about 40 nm. In some embodiments, a spacing $P_1$ (e.g., pitch size) between two adjacent vertical structures 402 can range from about 14 nm to about 40 nm. Based on the disclosure herein, any width and spacing associated with vertical structures 402 are within the scope and spirit of this disclosure.

In some embodiments, the process of forming vertical structure 402 can further include epitaxially growing at least one channel layers (e.g., 122A-122F) on substrate 102 to form channel region 122, before forming patterned hard mask layer 406. By way of example and not limitation, each channel layer 122A-122F can include Si or SiGe and can be grown using an epitaxial growth process, such as LPCVD, RTCVD, MOCVD, ALD, PECVD, or a combination thereof. Although FIG. 4 shows six channel layers 122A-122F, any number of channel layers can be epitaxially grown on substrate 102 to form channel region 122. In some embodiments, multiple sacrificial layers 404 can be epitaxially grown and interleaved with the epitaxially grown channel layers. In some embodiments, sacrificial layer 404 can include SiGe. In some embodiments, each vertical structure 402 can include buffer region 120, channel region 122, and sacrificial layers 404.

Figure 5:
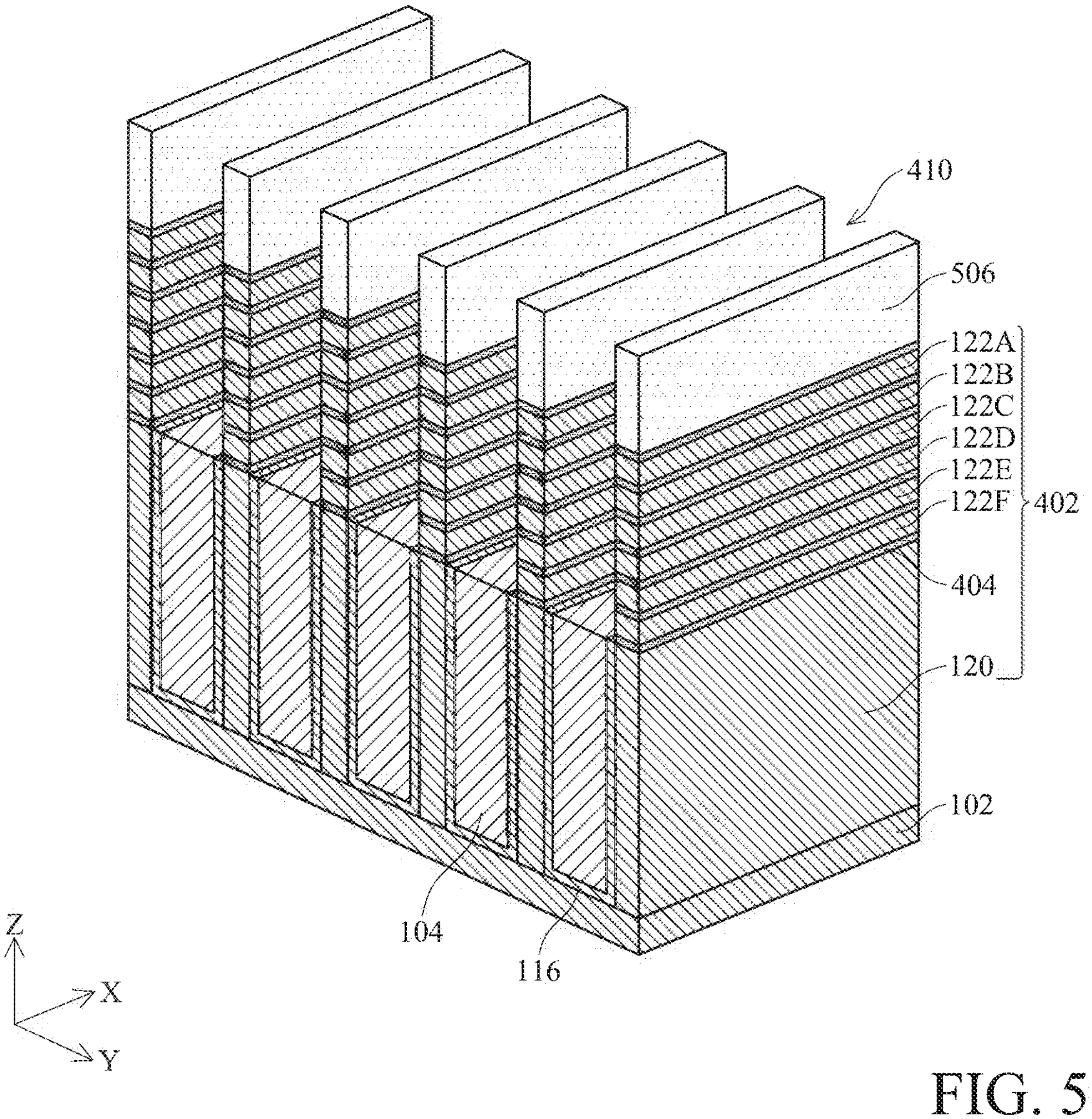
Figure 6:
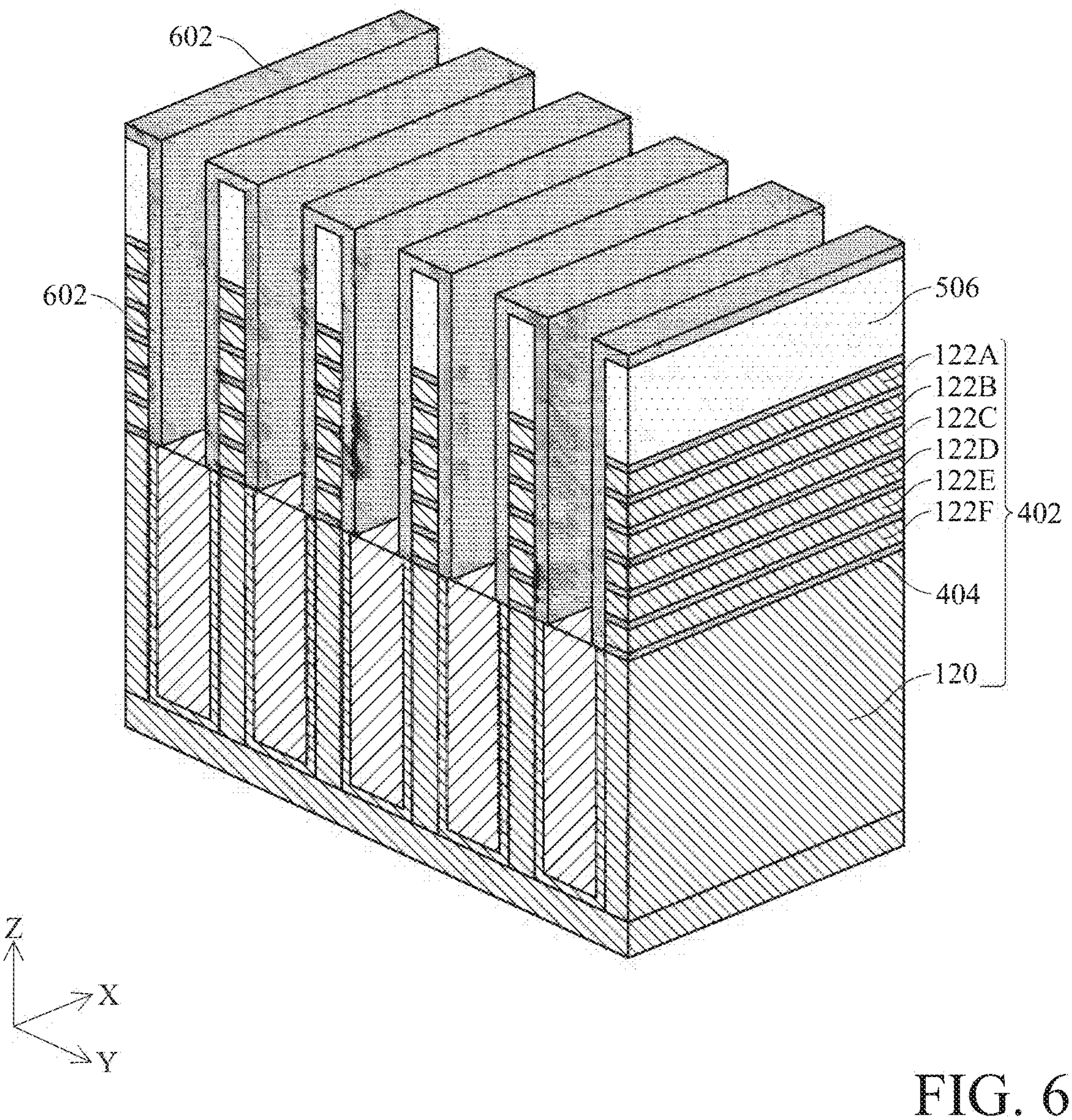
Figure 7:
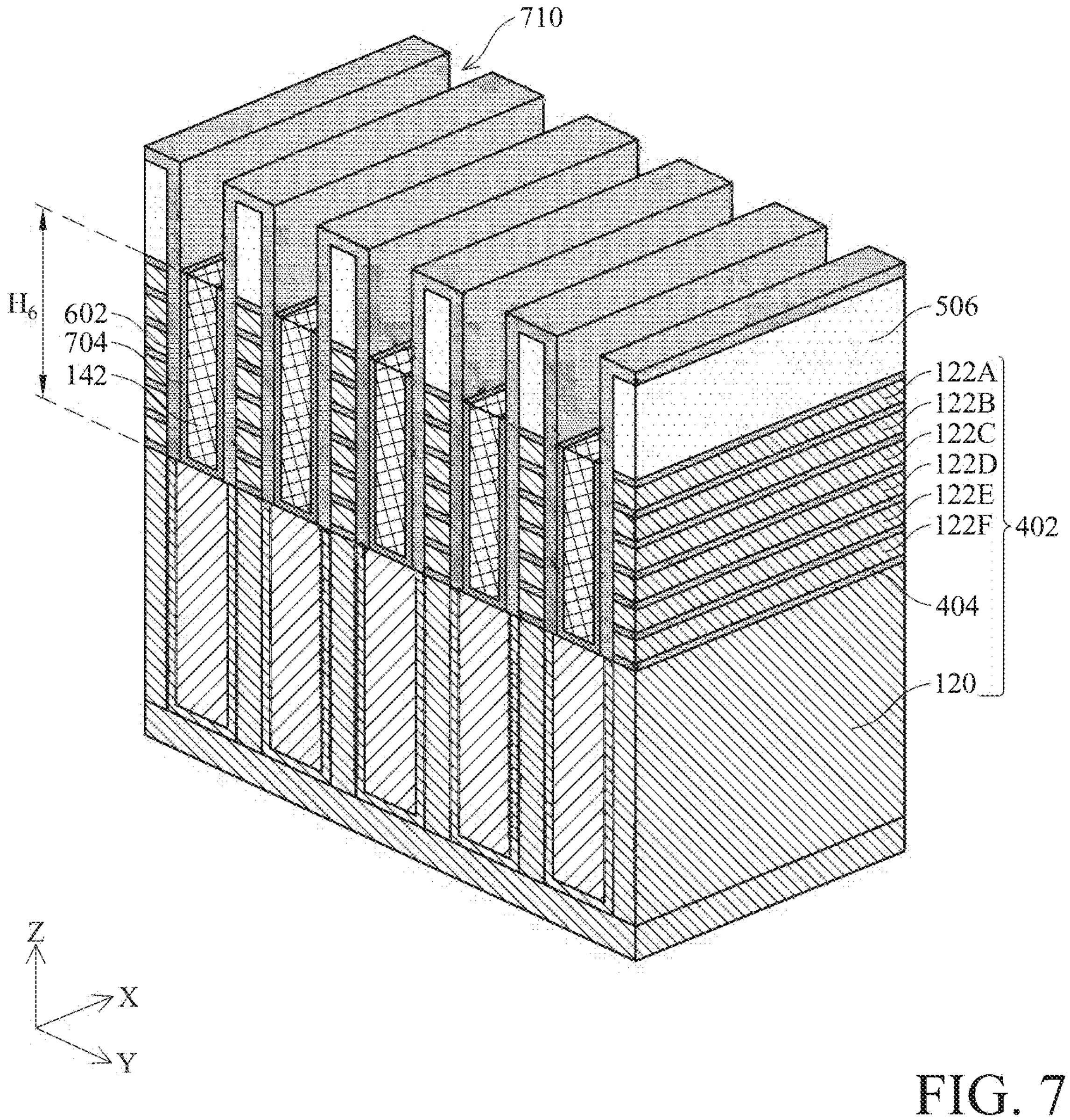

Further, in operation 305, STI regions 104 are formed. For example, STI regions 104 can be formed as described with reference to FIGS. 4-5. In some embodiments, as shown in FIG. 4, the process of forming STI region 104 can include depositing a protective layer 408 (e.g., conformally) over recess structures 410. Protective layer 408 can include a nitride material (e.g., $SiN_x$) and can be deposited using, for example, ALD or LPCVD. Furthermore, as shown in FIG. 5, the process of forming STI regions 104 can include depositing an insulating material over recess structures 410, annealing the insulating material, polishing (e.g., chemical mechanical polishing (CMP)) the annealed insulating material, and recessing the polished insulating material to form STI regions 104. In some embodiments, protective layer 408 can prevent oxidation of vertical structures 402 during the annealing of the insulating material. By way of example and not limitation, the insulating material can include, silicon oxide, silicon nitride, silicon oxynitride, fluoride-doped silicate glass (FSG), or a low-k dielectric material. In some embodiments, the process of depositing the insulating material can include any deposition method suitable for flowable dielectric materials (e.g., flowable silicon oxide). For example, flowable silicon oxide can be deposited for STI regions 104 using a flowable CVD (FCVD) process. The FCVD process can be followed by a wet anneal process. In some embodiments, the process of depositing the insulating material can include depositing a low-k dielectric material to form liner 116.

The annealing of the insulating material can include annealing the deposited insulating material in a steam at a temperature in a range from about 200° C. to about 700° C. for a period in a range from about 30 min to about 120 min. The anneal process can be followed by the polishing process that can remove portions of the layer of the insulating material. The polishing process can further remove portions of patterned hard mask layer 406 to form patterned hard mask layer 506, where a top surface of the insulating material after the polishing process can be substantially coplanarized with a top surface of patterned hard mask layer 506. The polishing process can be followed by the etching process to recess the polished insulating material to form STI regions 104. The recessing of the polished insulating material can be performed, for example, by a dry etch process, a wet etch process, or a combination thereof. In some embodiments, the dry etch process for recessing the polished insulating material can include using a plasma dry etch with a gas mixture that can include octafluorocyclobutane ($C_4F_8$), argon (Ar), oxygen ($O_2$), helium (He), fluoroform ($CHF_3$), carbon tetrafluoride ($CF_4$), difluoromethane ($CH_2F_2$), chlorine ($Cl_2$), hydrogen bromide (HBr), or a combination thereof with a pressure ranging from about 1 mTorr to about 5 mTorr. In some embodiments, the wet etch process for recessing the polished insulating material can include using a diluted hydrofluoric acid (DHF) treatment, an ammonium peroxide mixture (APM), a sulfuric peroxide mixture (SPM), hot deionized water (DI water), or a combination thereof. In some embodiments, the wet etch process for recessing the polished insulating material can include using an etch process that uses ammonia ($NH_3$) and hydrofluoric acid (HF) as etchants and inert gases, such as Ar, xenon (Xe), He, or a combination thereof. In some embodiments, the flow rate of HF and $NH_3$ used in the etch process can each range from about 10 sccm to about 100 sccm (e.g., about 20 sccm, 30 sccm, or 40 sccm). In some embodiments, the etch process can be performed at a pressure ranging from about 5 mTorr to about 100 mTorr (e.g., about 20 mTorr, about 30 mTorr, or about 40 mTorr) and a temperature ranging from about 50° C. to about 120° C.

Further, in operation 305, vertical structures 902 are formed. For example, vertical structures 902 can be formed as described with reference to FIGS. 6-9. In referring to FIG. 6, the process of forming vertical structures 902 (shown in FIG. 9) can include depositing seed layer 602 over recess structures 410 (shown in FIG. 5). Seed layer 602 can be in contact with side surfaces of vertical structures 402. In some embodiments, seed layer 602 can be in contact with a top surface and side surfaces of pattern hard mask layers 506. Seed layer 602 can include any suitable semiconductor material, such as SiGe, and can be deposited using any suitable deposition process, such as CVD or ALD. In referring to FIG. 7, the process of forming vertical structures 902 can include depositing (e.g., eonformally) a liner layer and a dielectric stack over vertical structures 402 and patterned hard mask layer 506, polishing (e.g., CMP) the liner layer and the dielectric stack, and recessing the polished liner and the dielectric stack to form recess structure 710 between vertical structures 402 via an etching process. The etching process for forming recess structures 710 can form liners 704 and dielectric stack 142 illustrated in the structure of FIG. 7. The material, the deposition process, the polishing process, and the etching process associated with the liner layer and the dielectric stack can be similar to those of STI regions 104. In some embodiments, a top surface of liner 704 and dielectric stack 142 can be substantially coplanar to that of vertical structure 402. In some embodiments, a top surface of liner 704 and dielectric stack 142 can be above vertical structure 402. In some embodiments, dielectric stack 142 can have a height $H_6$ ranging from about 10 nm to about 100 nm. In some embodiments, dielectric stack 142 can have a height $H_6$ ranging from about 20 nm to about 80 nm.

The process of forming vertical structure 902 can further include depositing an insulating dielectric layer into recess structures 710, polishing the insulating dielectric layer to form insulating block 144 (shown in FIG. 8), and etching patterned hard mask layer 506 (shown in FIG. 9). In some embodiments, a portion of seed layer 602 can be removed during polishing the insulating dielectric layer to form seed layer 802. The insulating dielectric layer can include a high-k material or any other suitable dielectric material which has high selectivity (e.g., larger than 1) to dielectric stack 142 and can be deposited using suitable deposition processes, such as ALD or CVD. As illustrated in FIG. 8, a top surface of insulating block 144 can be substantially coplanar to a top surface of patterned hard mask layer 506 after the polishing. Namely, insulating block 144 can have a height 117 that can be determined based on a height of patterned hard mask layer 506. In some embodiments, insulating block 144 can have a height $H_7$ substantially similar to that of hard mask layer 506. In some embodiments, insulating block 144 can have a height $H_7$ ranging from about 1 nm to about 50 nm, or from about 4 nm to about 30 nm. In some embodiments, a ratio between dielectric stack 142's height $H_6$ (shown in FIG. 7) and insulating block 144's height $H_7$ can range from about 0.05 and 20, or from about 0.125 and 8.

In referring to FIG. 9, patterned hard mask layer 506 can be selectively removed from the fabricated structure shown in FIG. 8. The etching of patterned hard mask layer 506 can use any suitable wet etching process or dry etching process that has high selectivity (e.g., larger than 1) to sacrificial layer 404 and insulating block 144. In some embodiments, the etching process for removing patterned hard mask layer 506 does not substantially change insulating block 144's height $H_7$. In some embodiments, after forming insulating block 144, each vertical structure 902 can include liner 704, dielectric stack 142, and insulating block 144 formed over dielectric stack 142. In some embodiments, after forming insulating block 144, each vertical structure 902 can include seed layer 802, dielectric stack 142, liners 704 that is in contact with seed layer 802 and dielectric stack 142, and insulating block 144 formed over dielectric stack 142.

Figure 10:
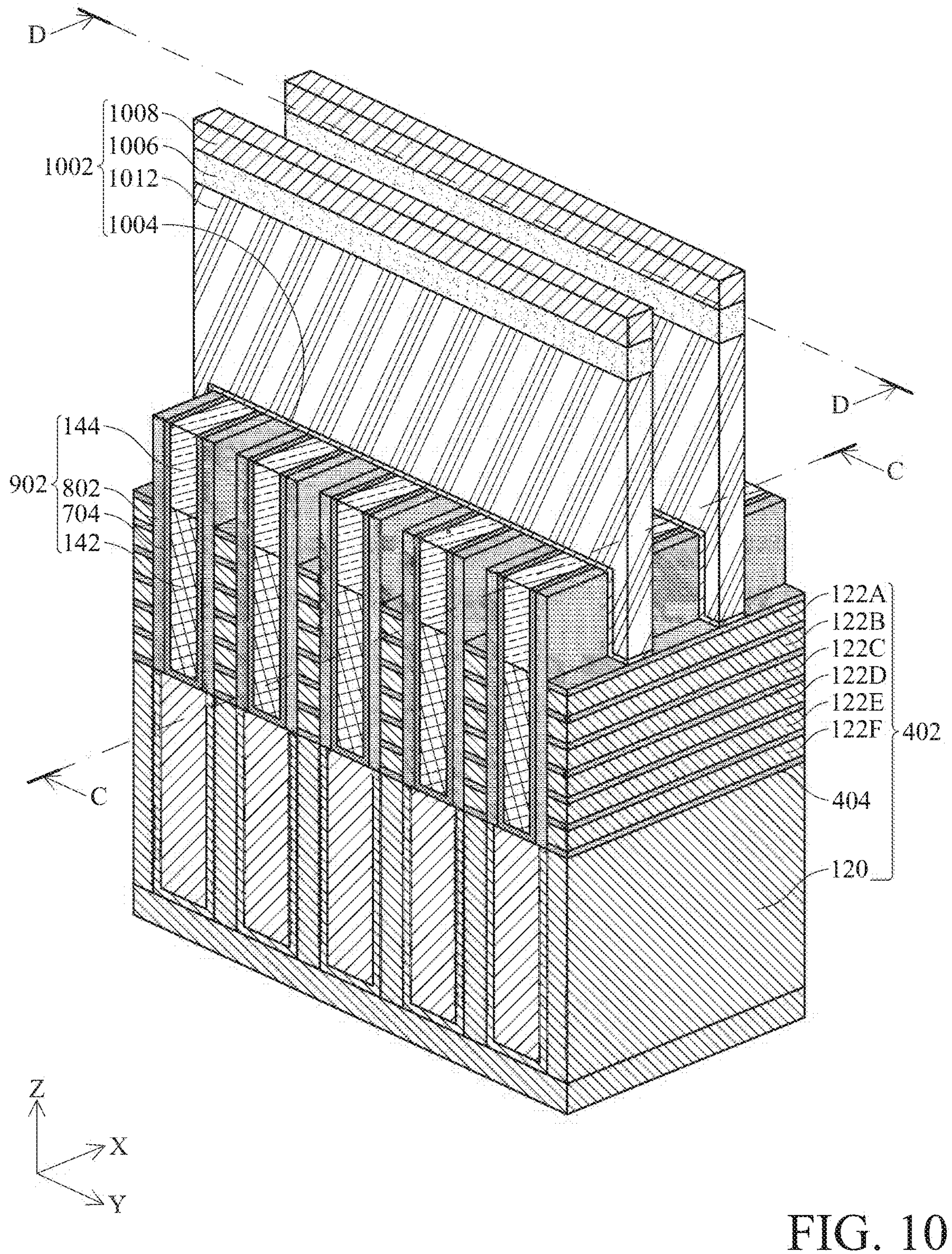
Figure 16:
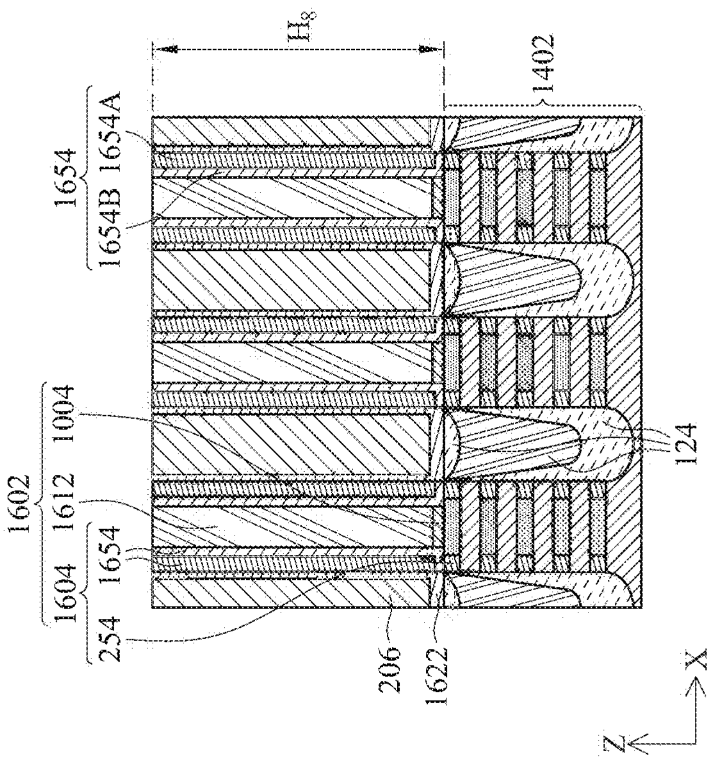

Referring to FIG. 3, in operation 310, a first gate structure is formed over the first and the second vertical structures. For example, as shown in FIG. 16, multiple gate structures 1602 are formed on vertical structures 1402. FIGS. 10-16 are isometric and/or cross-sectional views of partially fabricated structures that can be used to describe the fabrication stages of operation 310. In referring to FIG. 10, multiple sacrificial gate structures 1002 can be formed along a horizontal direction (e.g., y-axis) perpendicular to a longitudinal direction of vertical structures 402 and 902, Sacrificial gate structure 1002 can include a sacrificial gate dielectric 1004 and a sacrificial gate electrode 1012. In some embodiments, a vertical dimension of sacrificial gate electrode 1012 can be in a range from about 90 nm to about 200 nm. Although FIG. 10 shows two sacrificial gate structures 1002, any number of sacrificial gate structures 1002 can be formed parallel to each other. In some embodiments, sacrificial gate structure 1002 can further include capping layer 1006 and hard mask layer 1008. By way of example and not limitation, sacrificial gate dielectric 1004 can be deposited prior to deposition of sacrificial gate electrode 1012 and can be interposed between vertical structures 402 and sacrificial gate electrode 1012. In some embodiments, sacrificial gate dielectric 1004 can be interposed between vertical structures 902 and sacrificial gate electrode 1012. According to some embodiments, sacrificial gate dielectric 1004 can include a low-k dielectric material, such as silicon oxide or silicon oxynitride, and sacrificial gate electrode 1012 can include polycrystalline silicon (polysilicon). By way of example and not limitation, sacrificial gate dielectric 1004 and sacrificial gate electrode 1012 can be deposited as blanket layers using any suitable deposition process (e.g., PVD or CVD) and patterned with lithography and etching operations to form sacrificial gate structure 1002 over vertical structures 402 and 902.

Figure 12:
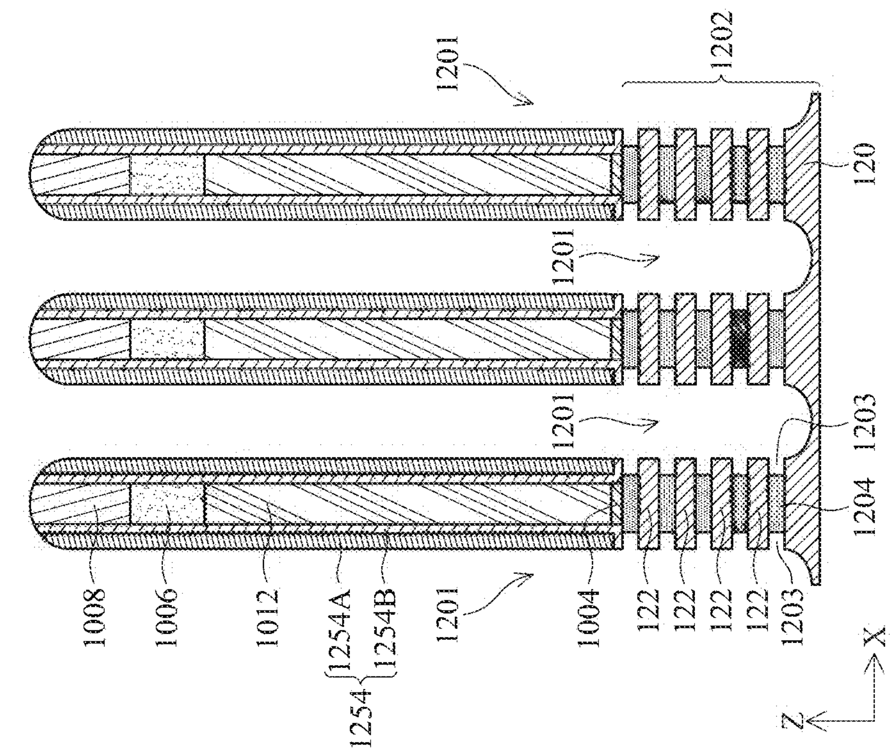
Figure 11:
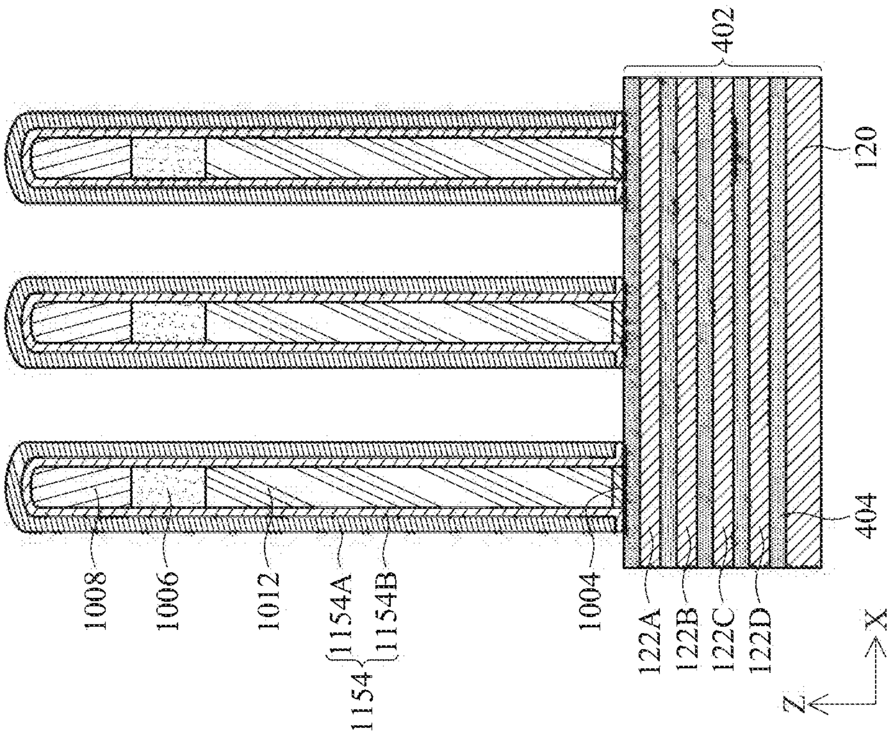
Figure 13:
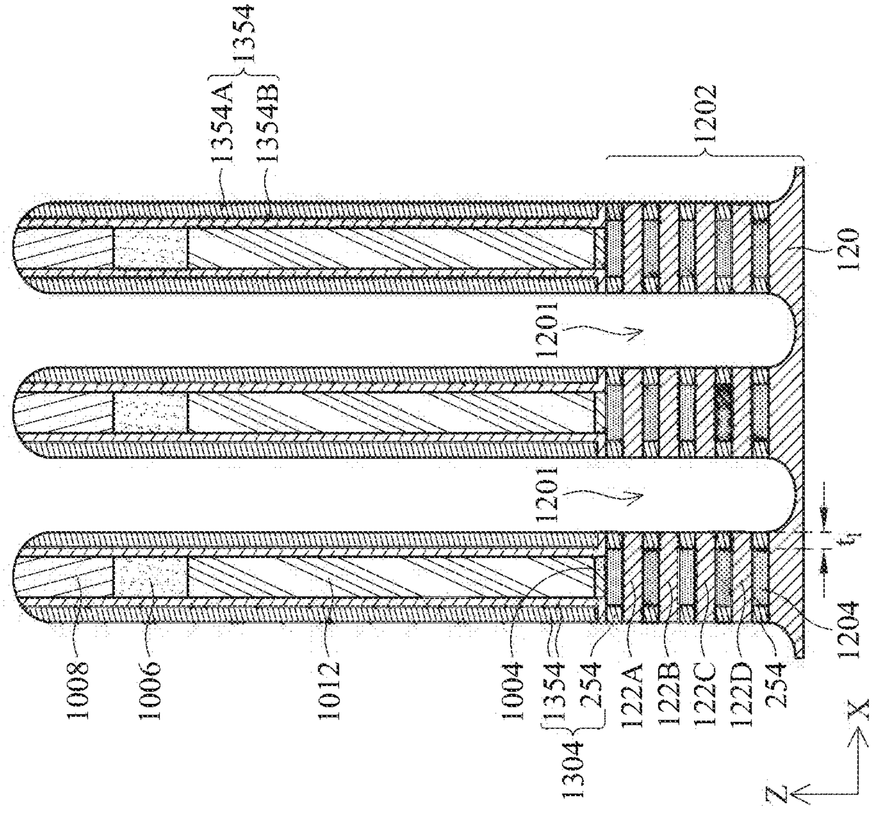

Further, in operation 310, spacer structures 1304 can be formed (shown in FIG. 13), as described with reference to FIG. 11-13. In referring to FIG. 11, the process of forming spacer structures 1304 can include forming a gate spacer 1154 over sacrificial gate structure 1002. FIG. 11 is a cross-sectional view of the structure along line C-C of FIG. 10 after forming gate spacer 1154 over sacrificial gate structure 1002. Although FIG. 11 shows four channel layers 122A-122D, any number of channel layers can be included in each vertical structure 402. In addition, although gate spacer 1154 in FIG. 11 includes two spacer layers (spacers 1154A and 1154B), any number of spacer layers can be included in gate spacer 1154. The process of forming gate spacer 1154 can include a surface treatment and a deposition of spacer material. In some embodiments, the surface treatment can include exposing sacrificial gate structure 1002 to an inhibitor to form H- or F-terminated surfaces on the sidewalk of sacrificial gate structure 1002. The H- or F-terminated surfaces can facilitate the deposition of the spacer material. The spacer material can be deposited using, for example, CVD or ALD. The surface treatment can be performed before or during the deposition process. The deposition process can be followed by, for example, an oxygen plasma treatment to remove a hydrophobic component on sacrificial gate structure 1002. In some embodiments, the spacer material can include (i) a dielectric material, such as silicon oxide, silicon carbide, silicon nitride, and silicon oxy-nitride, (ii) an oxide material, (iii) a nitride material, (iv) a low-k material, or (v) a combination thereof. In some embodiments, the spacer material of each spacer layer (e.g., spacer 1154A and 1154B) of gate spacer 1154 can be same or different from each other. The process of forming gate spacer 1154 can further include an etching process to remove a portion of the deposited spacer material. In some embodiments, the etching process can be an anisotropic etch that removes the spacer material faster on horizontal surfaces on the x-y plane) compared to vertical surfaces (e.g., on the y-z or x-z planes). In some embodiments, each spacer 1154A and 1154B can have a thickness in a range from about 2 nm to about 5 nm.

After forming gate spacer 1154, multiple recess structures 1201 can be formed along each vertical structure 402 to form vertical structure 1202. For example, as shown in FIG. 12, a process of forming recess structures 1201 can include removing channel layers within channel region 122, sacrificial layers 404, and buffer region 120 via an etching back process using sacrificial gate structure 1002 and gate spacer 1154 as hard masks. The etching back process can be an etching process using similar techniques as forming recess structures 410. For example, the etching process can be a dry etch process, a wet etch process, or a combination thereof. In some embodiments, the dry etch process can use reactive ion etching using a chlorine or fluorine based etchant. In some embodiments, the process of forming recess structures

1201 can remove a portion of gate spacer 1154 to form gate spacer 1254. For example, spacer 1254A and 1254B can be formed by respectively etching an upper portion of gate spacer 1154A and 1154B (e.g., portions of gate spacer 1154 that is placed at or near sacrificial gate structure 1002's top surface) during the process of forming recess structure 1201. In some embodiments, gate spacer 1254 can be substantially the same as gate spacer 1154 after forming recess structures 1201 (e.g., the etching processes for the process of forming recess structures 1201 has a lower etching rate towards gate spacer 1154).

In some embodiments, the process of forming spacer structures 1304 can further include forming inner spacers 254. The process of forming inner spacer 254 can include forming recess structures 1203 and filling each recess structure 1203 with a spacer material. As shown in FIG. 12, the process of forming recess structures 1203 can include recessing sacrificial layers 404 under sacrificial gate structures 1002 to form sacrificial layers 1204 via a selective etching process. By way of example and not limitation, channels layers within channel region 122 can be Si layers and sacrificial layers 404 can be a SiGe layers, where the selective etching process can be a drying etching process that is selective towards SiGe. For example, halogen-based chemistries can exhibit etch selectivity that is higher for Ge and lower for Si. Therefore, halogen gases can etch Ge faster than Si. Further, halogen gases can etch SiGe faster than Si. Thus, the selective etching process can be designed not to remove the channel layers after forming, recess structures 1203. In some embodiments, the halogen-based chemistries can include fluorine-based and/or chlorine-based gasses. Alternatively, a wet etch chemistry with high selectivity towards SiGe can be used. By way of example and not limitation, a wet etch chemistry can include a mixture of sulfuric acid ($H_2SO_4$) and hydrogen peroxide ($H_2O_2$) (SPM), or a mixture of ammonia hydroxide with $H_2O_2$ and water (APM). The filling of each recess structure 1203 can include depositing a blanket film in recess structures 1201 and 1203, and removing the blanket film that is outside recess structures 1203. The processes for forming and removing the blanket film can use similar techniques as forming gate spacer 1154. For example, the process of forming the blanket film can include depositing a dielectric material using CVD or ALD; the process of removing the blanket film can include using a dry etch process, a wet etch process, or a combination thereof. In some embodiments, as shown in FIG. 13, each inner spacer 254 can have a thickness $t_1$ range from about 1 nm to about 9 nm.

In some embodiments, the process of forming inner spacer 254 can also remove a portion of gate spacer 1254 to form gate spacer 1354. For example, spacers 1354A and 1354B can be formed by respectively removing an upper portion of spacers 1254A and 1254B during the process of forming inner spacers 254. In some embodiments, gate spacer 1354 can be substantially the same as gate spacer 1254 after forming inner spacers 254. As a result, spacer structure 1304 can include gate spacer 1354 and inner spacers 254.

Figure 14:
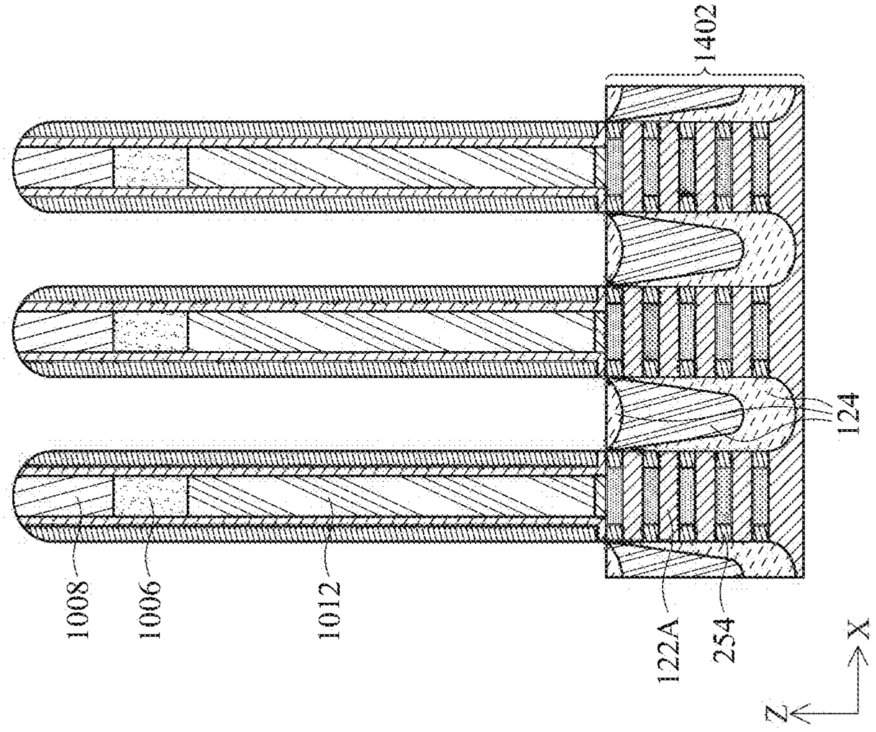

Referring to FIG. 3, in operation 310, after forming spacer structure 1304, source-drain regions 124 can be formed by epitaxially growing source-drain stacks in recess structures 1201. The epitaxial growth of source-drain regions 124 can use a similar epitaxial growth process as growing channel layers for forming channel region 122 and/or sacrificial layers 404. In some embodiments, the epitaxial growth process can grow at least one SiGe layer or at least one Si layer to form source-drain regions 124. For example, as shown in FIG. 14, the epitaxial growth process can grow three SiGe layers in recess structures 1201. The epitaxial growth process can in-situ dope source-drain regions 124 using p-type doping precursors or n-type doping precursors. By way of example and not limitation, the p-type doping precursors can include diborane ($B_2H_6$), boron trifluoride ($BF_3$), and the n-type doping precursors can include phosphine ($PH_3$), arsine ($AsH_3$), or other suitable materials. In some embodiments, the epitaxial growth process can form source-drain regions 124, where a top of source-drain regions 124 can be above a top of topmost channel layer (e.g. 122A) within channel region 122. In some embodiments, the epitaxial growth process can form source-drain regions 124, where a top of source-drain regions 124 can be substantially coplanar with a bottom of sacrificial gate structures 1002. In some embodiments, the epitaxial growth process for forming source-drain regions 124 can form vertical structures 1402 from vertical structures 1202, where vertical structure 1402 can be an embodiment of FET 106.

Figure 15:
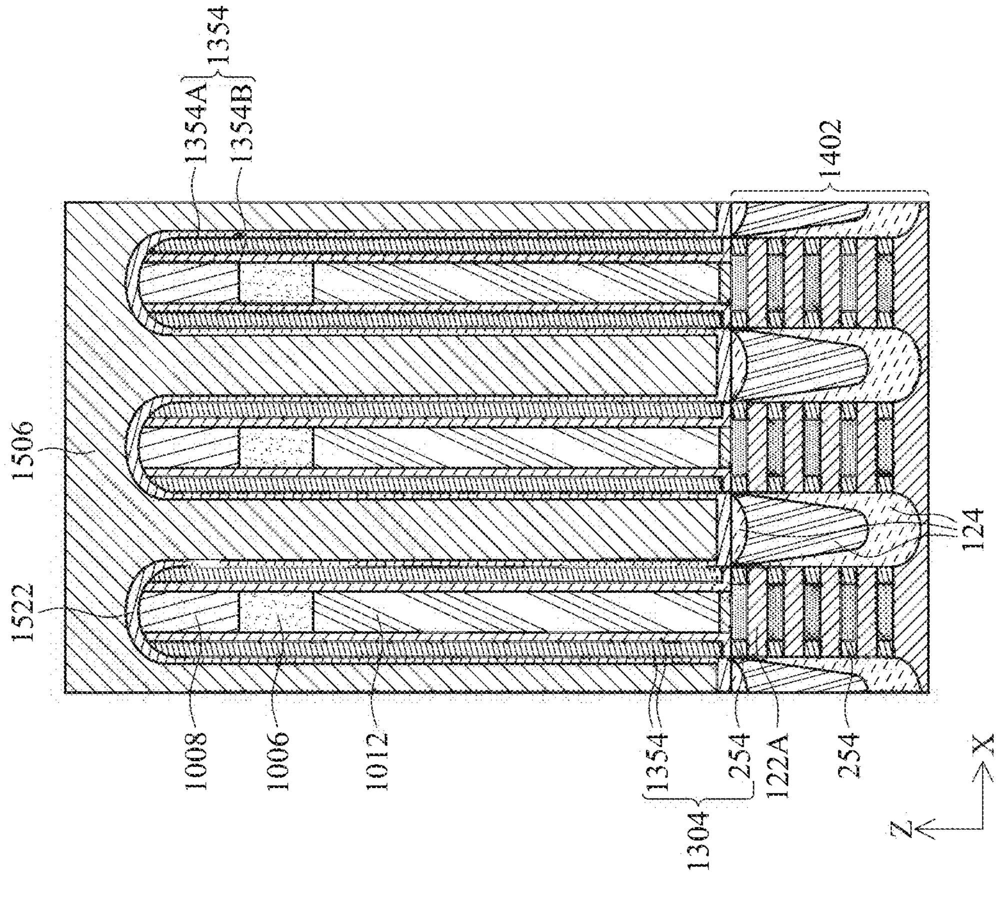

Further, in operation 310, a CESL 1622 and insulating layer 206 can be formed as described with reference to FIGS. 15-16. The process of forming CESL 1622 and insulating layer 206 can include depositing a CESL 1522 and an insulating layer 1506 (shown in FIG. 15). CESL 1522 can include silicon nitride, silicon oxynitride, silicon carbide, boron nitride, silicon boron nitride, a composite of boron nitride and silicon carbide, or a combination thereof, and can be formed using any suitable deposition process such as LPCVD, PECVD, CVD, or ALD. Insulating layer 1506 can be a low-k dielectric material deposited using a deposition method suitable for flowable dielectric materials (e.g., flowable silicon oxide). For example, flowable silicon oxide can be deposited for insulating layer 1506 using FCVD. The process of forming CESL 1622 and insulating layer 206 can further include applying a polishing process (e.g., CMP) to remove a portion of CESL 1522 and a portion of insulating layer 1506. In some embodiments, the polishing process can also remove sacrificial gate structure 1002 to form gate structures 1602. For example, the polishing process can remove hard mask layer 1008, capping layer 1006, an upper portion of sacrificial gate electrode 1012, and an upper portion of gate spacer 1354. As a result, as shown in FIG. 16, the process of forming CESL 1622 and insulating layer 206 can concurrently form gate structure 1602 that includes sacrificial gate dielectric 1004, sacrificial gate electrode 1612 placed over sacrificial gate dielectric 1004, and spacers 1604 embedding sacrificial gate electrode 1612 and sacrificial gate dielectric 1004, where spacers 1604 can include inner spacers 254 and gate spacer 1654. In some embodiments, the polishing process can remove a portion of gate spacers 1354A and 1354B to respectively form gate spacers 1654A and 1654B. In some embodiments, referring to FIG. 16, a vertical dimension $H_8$ of gate structure 1602 can be in a range from about 50 nm to about 120 nm.

Figure 18:
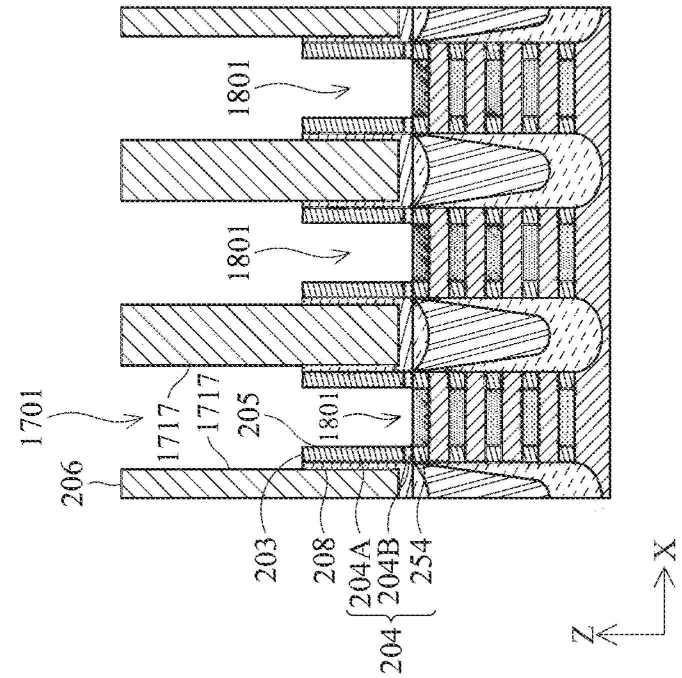
Figure 17:
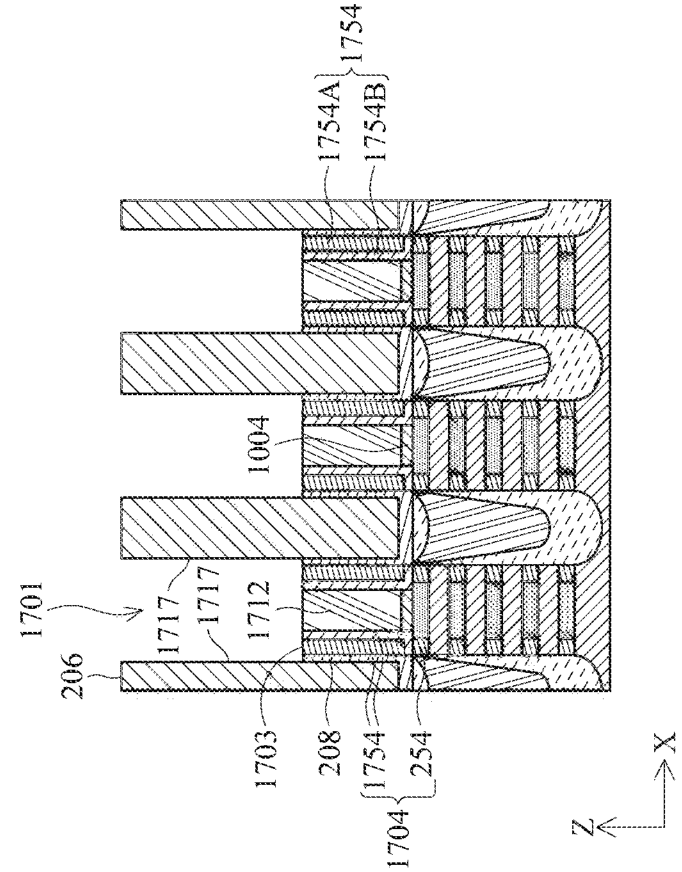

Referring to FIG. 3, in operation 315, a recess structure is formed in each of the first gate structures. FIGS. 17-18 are cross-sectional views of partially fabricated structures that can be used to describe the fabrication stages of operation 315. In referring to FIG. 17, recess structure 1701 can be formed horizontally (e.g., in the x-direction) between insulating layers 206 (e.g., ILD structure 130) to expose a portion of the insulating layers 206. For example, side surfaces 1717 (shown in FIG. 17) can represent the exposed side surfaces of insulating layer 206. In some embodiments, side surfaces 1717 can represent exposed surfaces of CESL 1622 (e.g., ILD structure 130). The process of forming recess structure 1701 can include forming gate electrode 1712 by removing a portion of gate electrode 1612 using a dry etching process (e.g., reaction ion etching) or a wet etching process that has a higher etching rate towards gate electrode 1612 and a lower etching rate towards (e.g., selectivity larger than 1) gate spacer 1654 (e.g., gate spacers 1654A and 1654B). In some embodiments, the gas etchants used in the dry etching process for removing gate electrode 1612 can include chlorine, fluorine, or bromine. In some embodiments, an $NH_4OH$ wet etch can be used to remove the portion of gate electrode 1612. In some embodiments, a dry etch followed by a wet etch can be used to remove the portion of gate electrode 1612.

The process of forming recess structure 1701 can further include removing a portion of spacer 1604 to form spacer 1704. For example, gate spacer 1754 can be formed by removing a portion of gate spacer 1654. In some embodiments, spacers 1754A and 1754B can be formed by respectively removing a portion of spacer 1654A and a portion of gate spacer 1654B. The process of removing the portion of spacer 1604 can include a dry etching process or a wet etching process that has a low etching rate towards (e.g., selectivity larger than 1) to gate electrode 1712. In some embodiments, after removing the portion of spacer 1604, a top surface 1703 of gate spacer 1704 can be substantially coplanar with a top of gate electrode 1712. In some embodiments, a top surface 1703 can be substantially coplanar with or above a top surface of each isolation structure 902. In some embodiments, the dry etching process or the wet etching process for removing the portion of spacer 1604 can have low etching rate towards (e.g., selectivity larger than 1) to CESL 1622 or insulating layer 206. In some embodiments, the process of forming recess structure 1701 can also include forming CESL 208 by removing a portion of CESL 1622 using similar etching process that removes the portion of spacer 1604, such as a dry etch process or a wet etch process that has a higher etching rate towards CESL 1622 and a lower etching rate (e.g., selectivity larger than 1) towards insulating layer 206 and/or gate spacer 1754.

As shown in FIG. 18, a process of forming recess structure 1801 can include removing gate electrode 1712 via an etching process that uses similar techniques to remove gate electrode 1612. For example, the etching process can include a dry etching process (e.g., reactive ion etching) or a wet etching process that has a higher etching rate towards gate electrode 1712 and a lower etching rate (e.g., selectivity larger than 1) towards sacrificial layer 1204. The process of forming recess structure 1801 can further include removing sacrificial gate dielectric 1004 to expose topmost of sacrificial layers 1204 via any suitable etching process, such as a wet etching process. The removal of gate electrode 1712 and sacrificial gate dielectric 1004 can also expose side surfaces of spacer 1704. In some embodiments, spacer 1704 can represent spacer structure 204 (shown in FIGS. 2A and 18). In some embodiments, a portion of spacer 1704 can be removed to form spacer structure 204 using any suitable etching process, such as a wet etching process or a dry etching process. For example, a portion of spacers 1754A and 1754B can be removed to respectively form spacers 204A and 204B. As a result, each gate structure 1602 can include recess structure 1801 that exposes a top of topmost sacrificial layer 1204, spacer structure 204's side surfaces 205, spacer structure 204's top surface 203, and ILD structure 130's side surfaces 1717. In some embodiments, recess structure 1801 exposes a topmost channel layer within channel region 122.

Figure 20:
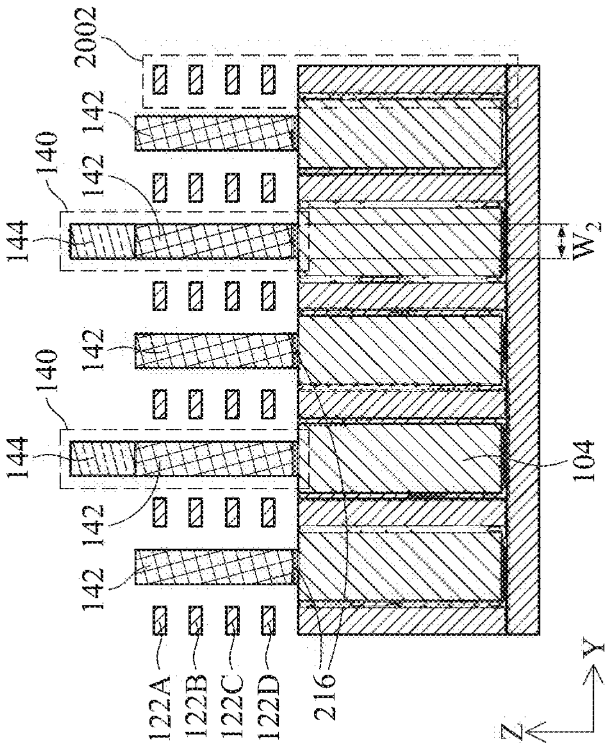
Figure 19:
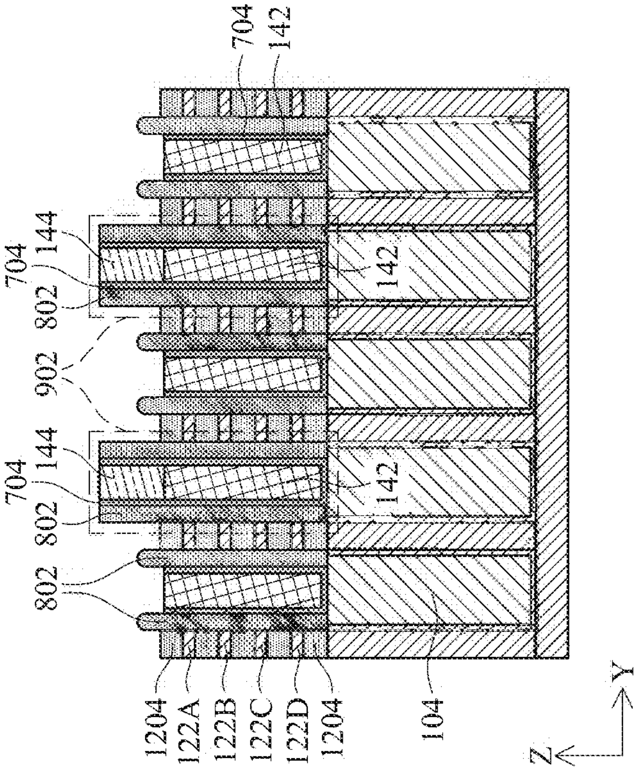

Further, in operation 315, after forming recess structure 1801, multiple isolation structures 140 can be formed with reference to FIGS. 19 and 20. In some embodiments, the process of forming isolation structures 140 can include removing one or more insulating blocks 144 from respective one or more vertical structures 902. For example, FIG. 19 is a cross-sectional view of the structure along line D-D (under a gate structure 1602) of FIG. 10 after the fabrication steps of FIGS. 10-18 and the removal of selected insulating blocks 144. Comparing FIG. 10 to FIG. 19, three insulating blocks 144 are removed (e.g., FIG. 10 illustrates five insulating blocks 144), thus leaving two insulating blocks 144 on vertical structures 902 (shown in FIG. 19). Although FIG. 19 indicates that three insulating blocks 144 are removed from vertical structures 902, any number of insulating blocks 144 can be removed. The process of removing the one or more insulating blocks 144 can include patterning a hard mask stack (not shown in FIG. 19) on a selected vertical structures 902 and etching insulating blocks 144 using the hard mask stack. As a result, after the etching process, the one or more insulating blocks 144 outside the hard mask stack can be removed and other insulating blocks 144 covered by the hard mask stack can remain in vertical structures 902. By way of example and not limitation, the etching of the group of insulating blocks can include any suitable dry etching process or a wet etching process that has low etching rate towards (e.g., selectivity larger than 1) seed layer 802 and/or sacrificial layer 404.

In referring to FIG. 20, the process of forming isolation structure 140 can further include removing seed layer 802 and removing a portion of liners 704 to expose sidewalk of dielectric stack 142 and/or sidewalls of insulating block 144. FIG. 20 is a cross-sectional view of the structure along line D-D (under a gate structure 1602) of FIG. 10 after the fabrication step of FIG. 19. The process of removing seed layer 802 can include any suitable etching process that has a higher etching rate towards seed layer 802 and a lower etching rate towards channel regions 122. For example, channel region 122 can include Si, and seed layer 802 can include SiGe. Therefore, seed layer 802 can be removed using a selective etching process that selectively etches SiGe from Si. The process of removing liners 704 can form liner 216 under dielectric stack 142; the removal of liners 704 can be via a dry etch process, a wet etch process, or a combination thereof. In some embodiments, the process of forming isolation structure 140 can also include a trimming, process to reduce a width ($W_2$) of isolation structure 140. In some embodiments, isolation structure 140 can have a width $W_2$ equal to or larger than 6 nm, or equal to or larger than 3 nm.

In some embodiments, the process of forming isolation structure 140 can further include removing sacrificial layers 1204 using similar techniques as removing seed layer 802. For example, sacrificial layer 1204 can be removed using a selective etching process that has a higher etching rate towards sacrificial layer 1204 and a lower etching rate towards channel layers 122. As a result, as illustrated in FIG. 20, channel layers (e.g., 122A-122D) within channel region 122 can become a nano-sheet structure or a nano-wire structure under each gate structure 1602. In some embodiments, the process of forming the nano-sheet or the nano-wire structure for channel regions 122 can form vertical structures 2002 from vertical structures 1202, where vertical structure 2002 can be an embodiment of FET 106. In some embodiments, vertical structure 2002 can be a fin structure (e.g., device 100B is a finFET; not shown in FIG. 20).

Referring to FIG. 3, in operation 320, the first gate structure is replaced with a second gate structure. FIGS. 21-26 are cross-sectional views of partially fabricated structures that can be used to described the fabrication stages of operation 320, where FIGS. 25 and 26 can represent different embodiments of the fabricated structure shown in FIG. 24. The process of replacing gate structure 1602 with gate structure 110 can include filling a dielectric layer 2102 and a gate electrode 2104 in recess structures 1701 and 1801. In referring to FIG. 21 (cross-sectional view along line C-C of FIG. 10 after fabrication steps of FIGS. 11-20), the filling of dielectric layer 2102 can include depositing (e.g., conformally) dielectric layer 2102 over ILD structure 130's side surfaces 1717, spacer 204's top surface 203, and spacer 204's side surface 205. Further, in referring to FIG. 22 (cross-sectional view along line D-D of FIG. 10 after fabrication steps of FIGS. 11-20; same fabrication stage as FIG. 21), the filling of dielectric layer 2102 can further include depositing (e.g., conformally) dielectric layer 2102 over a top and sides of each insulating block 144, side surfaces of each dielectric stack 142, and a top and sides of each channel layer (e.g., 122A-122D) within channel region 122. In some embodiments, the filling of dielectric layer 2102 can also include depositing (e.g., conformally) dielectric layer 2102 over a top of a group of dielectric stack 142 and a bottom of each channel layers (e.g., 122A-122D) within channel region 122. In some embodiments, the filling of dielectric layer 2102 can also include depositing (e.g., conformally) dielectric layer 2102 and gate electrode 2104 over a portion of a top of each STI region 104.

Dielectric layer 2102 can include silicon oxide and can be formed by CVD, ALD, PVD, e-beam evaporation, or other suitable process. In some embodiments, dielectric layer 2102 can include (i) a layer of silicon oxide, silicon nitride, and/or silicon oxynitride, (ii) a high-k dielectric material, such as hafnium oxide ($HfO_2$), $TiO_2$, HfZrO, $Ta_2O_3$, $HfSiO_4$, and $ZrO_2$, $ZrSiO_2$, (iii) a high-k dielectric material having oxides of lithium (Li), beryllium (Be), magnesium (Mg), calcium (Ca), strontium (Sr), scandium (Sc), yttrium (Y), Zr, Al, lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iv) a combination thereof. The High-k dielectric material can be formed by ALD and/or other suitable processes. In some embodiments, dielectric layer 2102 can include a single layer or a stack of insulating material layers.

After the filling of dielectric layer 2102, the filling of gate electrode 2104 can include depositing gate electrode 2104 over dielectric layer 2102. Gate electrode 2104 can include a single metal layer or a stack of metal layers. The stack of metal layers can include metals different from each other. In some embodiments, gate electrode 2104 can include a suitable conductive material, such as Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and/or combinations thereof. Gate electrode 2104 can be formed by ALD, PVD, CVD, or other suitable deposition process.

Figure 22:
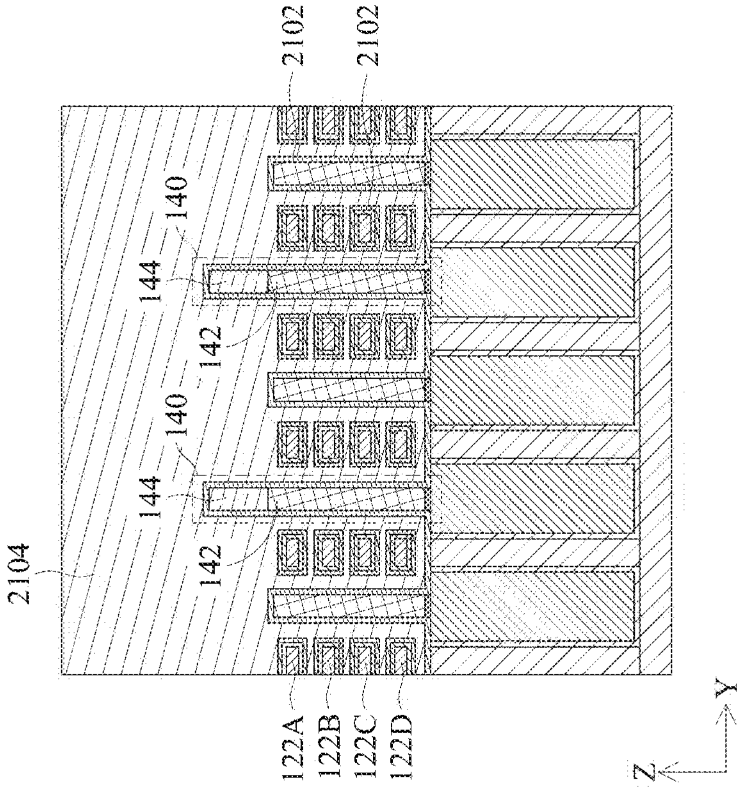
Figure 21:
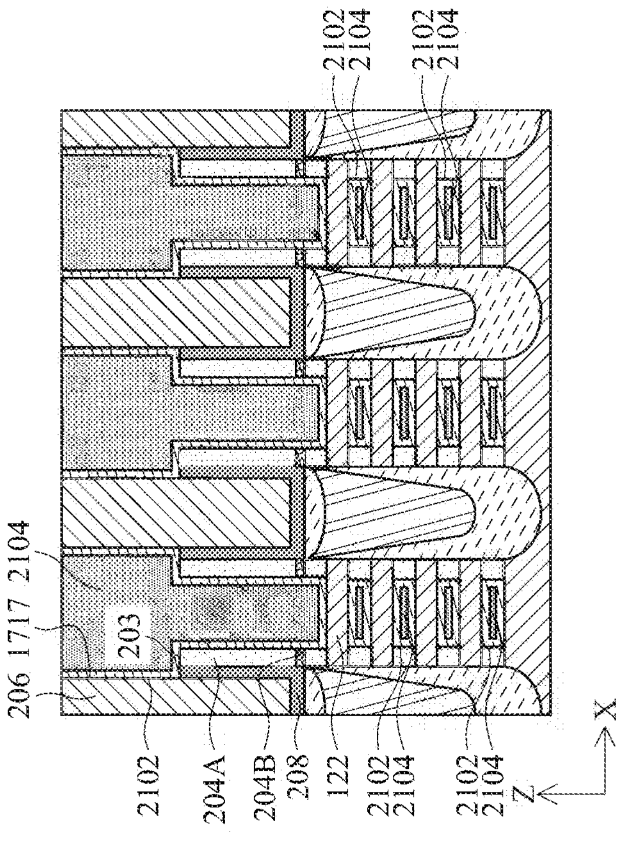

The process of replacing of gate structure 1602 with gate structure 110 can also include planarizing the deposited dielectric layer 2102 and gate electrode 2104 via a polishing process (e.g., CMP). As shown in FIG. 21, the polishing process can planarize top surfaces of dielectric layer 2102 and gate electrode 2104 with the top surface of ILD structure 130 (e.g., insulating layer 206). In some embodiments, as shown in FIG. 22, the top surfaces of gate electrode 2104 can be above a top surface of each isolation structure 140.

Figure 23:
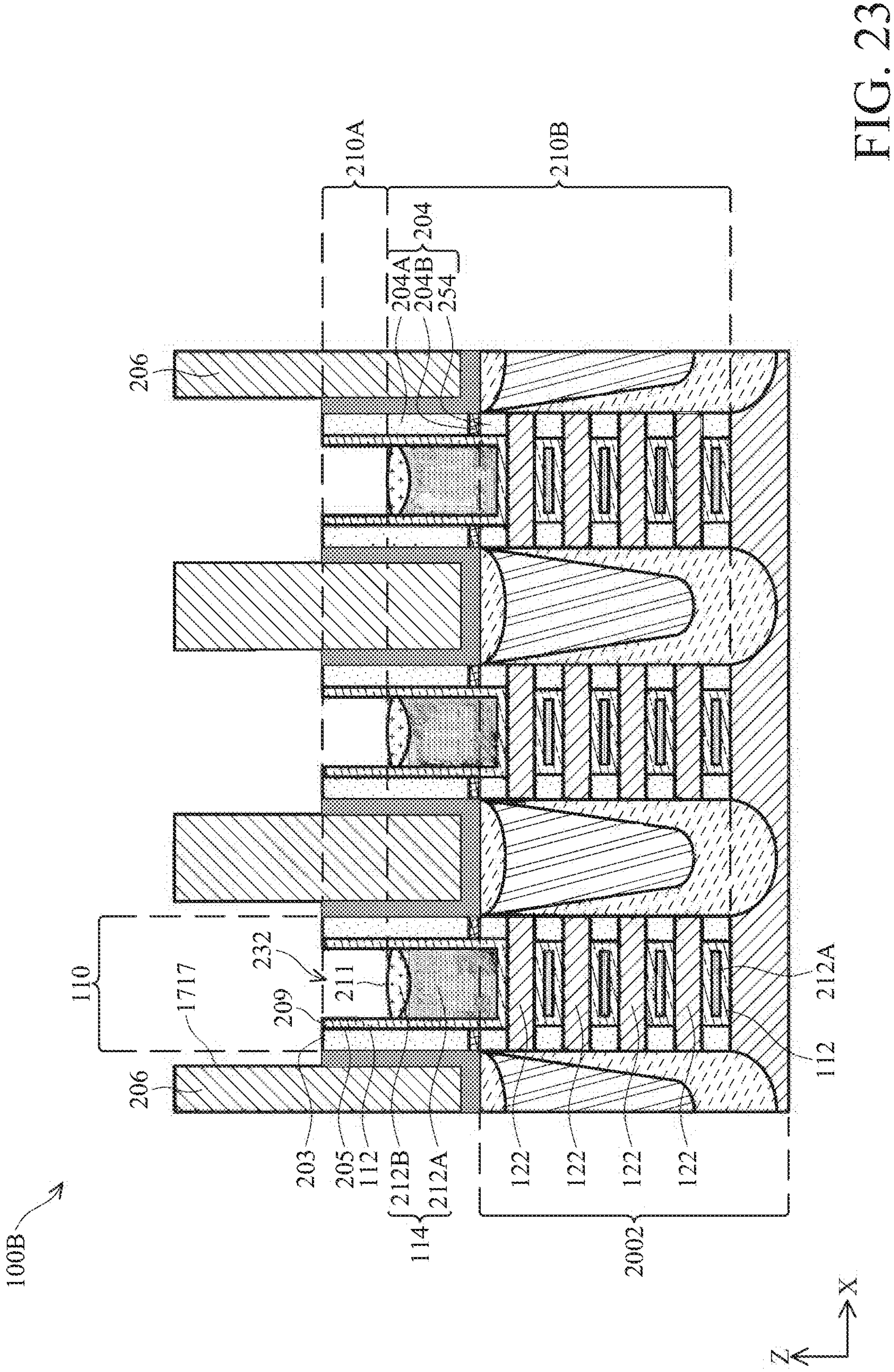

The process of replacing gate structure 1602 with gate structure 110 can further include recessing a portion of the planarized dielectric layer 2102 to form dielectric layer 112, and recessing a portion of the planarized gate electrode 2104. For example, as shown in FIG. 23 (a cross-sectional view of line C-C of FIG. 10 after fabrication steps of FIGS. 11-21), a portion of the planarized dielectric layer 2102 and a portion of the planarized gate electrode 2104 that are formed over ILD structure 130's side surfaces 1717 and spacer structure 204's top surface 203 can be removed by a metal-gate-dielectric etching process. By way of example and not limitation, the metal-gate-dielectric etching process can be any suitable dry etching process and/or any suitable wet etching process that etch both dielectric layer 2102 and gate electrode 2104.

After forming dielectric layer 112, the process of replacing gate structure 1602 with gate structure 110 can also include forming recess structure 232 for dielectric layer 112 by further recessing an tipper portion of the recessed gate electrode 2104 to form gate electrode 114 (e.g., lower electrode 212A) by a metal-gate etching process. By way of example and not limitation, the metal-gate etching process can be any suitable dry etching process and/or any suitable wet etching process that can selectively etch gate electrode 2104 from dielectric layer 112 (e.g., etching selectivity larger than 1). For example, as shown in FIG. 23, the metal-gate etching process can selectively remove gate electrode 2104, formed over dielectric layer 112's upper portion 210A from dielectric layer 112. After such metal-gate etching process, dielectric layer 112's upper portion 210A can be exposed while dielectric layer 112's lower portion 210B can still be covered by the remaining gate electrode 114. Since the metal-gate etching process has negligible etching effect on dielectric layer 112, after the process of forming gate electrode 114, dielectric layer 112 can remain covering spacer structure 204's side surfaces 205. As a result, dielectric layer 112 can protect spacer structure 204's integrity during subsequent fabrication steps of integrated circuits, such as forming metal contacts/interconnections. In some embodiments, gate electrode 114's top surface 211 can be below recess structure 232's top surface 209 and spacer structure 204's top surfaces 203.

Figure 24:
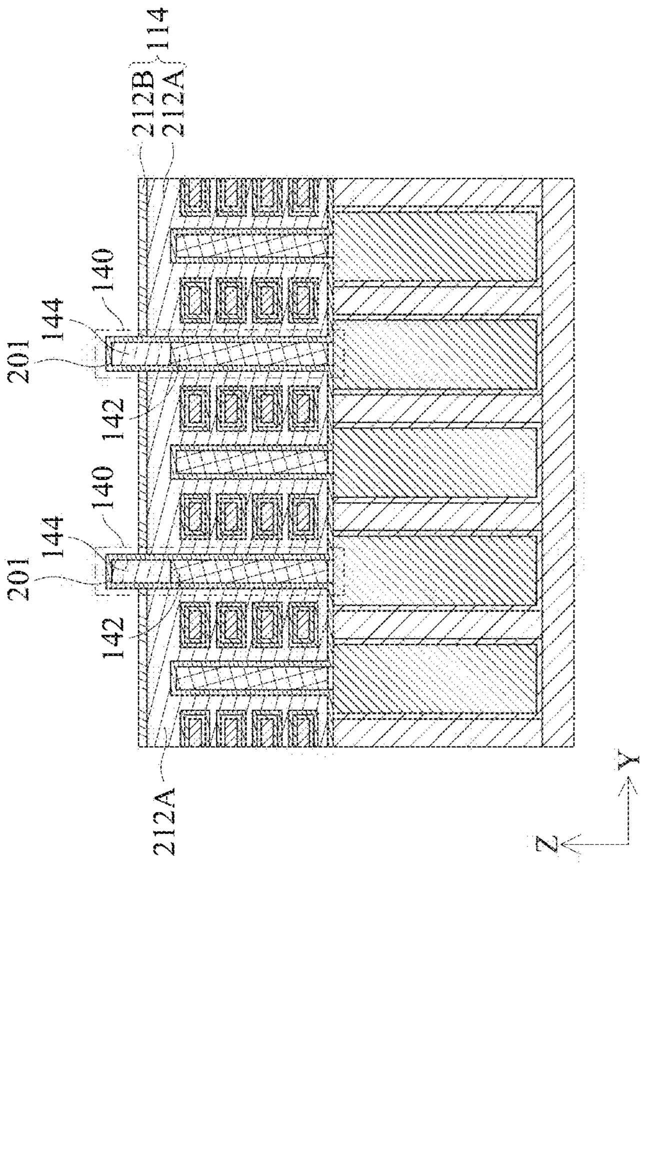

Further, the metal-gate etching process can be configured to selectively etch gate electrode 2104 from insulating blocks 144. For example, as shown in FIG. 24, after the process of forming gate electrode 114 (e.g., forming lower gate electrode 212A), gate electrode 114's top surface 211 can be substantially coplanar with or below insulating block 144's top surface 201. In other words, insulating block 144 can protect the underlying dielectric stack 142 during the process of forming gate electrode 114, thus protecting isolation structure 140's integrity after replacing gate structure 1602 with gate structure 110. In some embodiments, insulating block 144's top surface 201 can be below spacer structure 204's top surface 203.

In some embodiments, after the metal-gate etching process that forms lower electrode 212A, the process of forming gate electrode 114 can further include growing upper electrode 212B over lower electrode 212A. Upper electrode 212B can include a low resistance metal, such as tungsten, and can be grown via a plating or a deposition using similar techniques that forms gate electrode 2104, such as ALD, PVD, and CVD. In some embodiments, upper electrode 212B's top surface 211 (e.g., also gate electrode 114's top surface 211) can be below recess structure 232's top surface 209, spacer structure 204's top surface 203, and insulating block 144's top surface 201.

Figure 25:
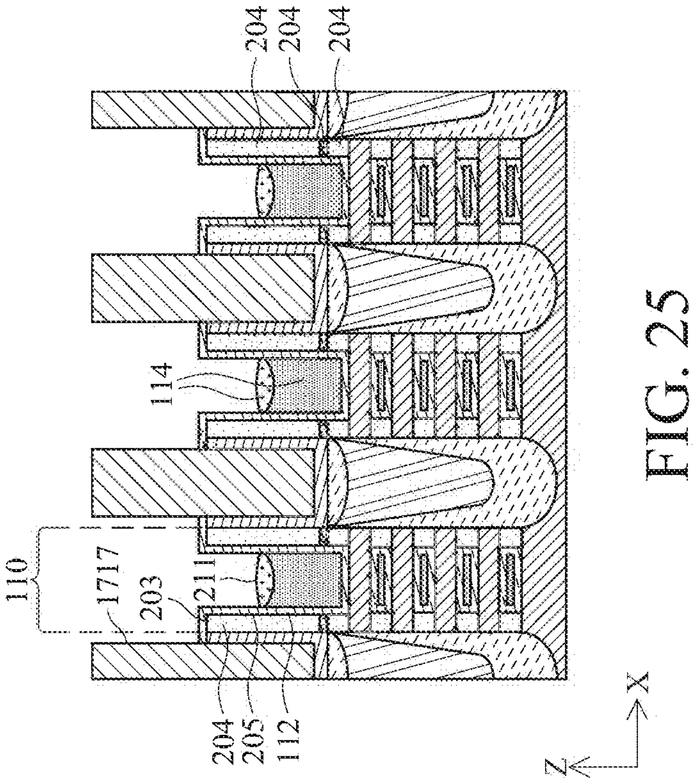

In some embodiments, in comparing FIG. 21 to FIG. 25, the process of forming dielectric layer 112 can include using the metal-gate-dielectric etching process to remove a portion of dielectric layer 2102 that is above spacer structure 204's top surface 203 (e.g., upper portion of side surface 1717 in FIG. 25 becomes exposed). As a result, as shown in FIG. 25, dielectric layer 112 can be configured to cover (e.g., protect) both spacer structure 204's top surface 203 and side surfaces 205, after replacing gate structure 1602 with gate structure 110.

Figure 26:
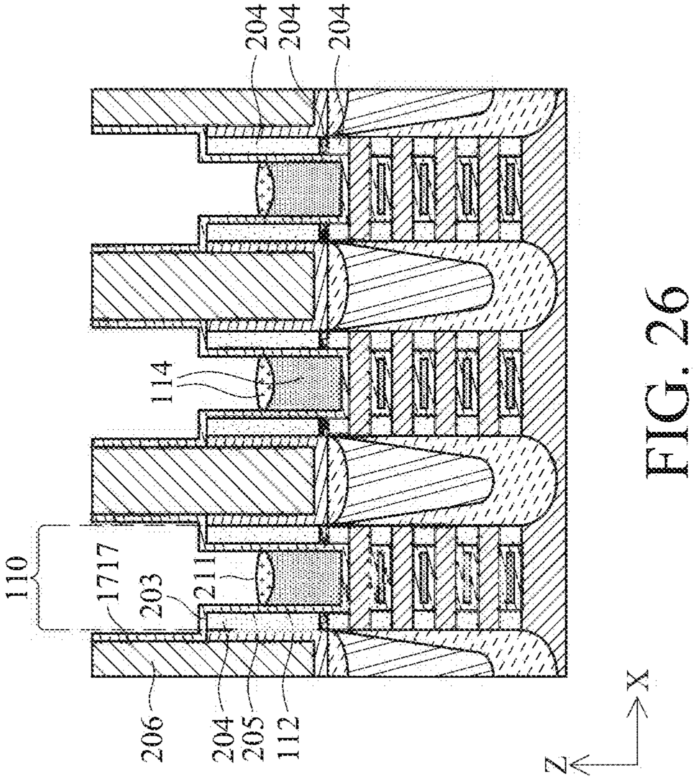

In some embodiments, in comparing FIG. 21 to FIG. 26, the process of replacing gate structure 1602 with gate structure 110 can include filling dielectric layer 2102 and gate electrode 2104 in recess structures 1701 and 1801 (previously described in FIG. 21), planarizing dielectric layer 2102 and gate electrode 2104 (previously described in FIG. 21), and selectively recess an upper portion of the polished gate electrode 2104 from the planarized dielectric layer 2102 (e.g., dielectric layer 2102 can be un-etched and can represent dielectric layer 112) via the metal-gate etching process. For example, as shown in FIG. 26, after replacing gate structure 1602 with gate structure 110, dielectric layer 112 can cover (e.g., protect) spacer structure 204's top surface 203, spacer structure 204's side surfaces 205, and insulating layer 206's side surfaces 1717, where gate electrode 114's top surface 211 can be below spacer structure 204's top surface 203 and insulating block 144's top surface 201 (block 144 is shown in FIG. 24).

In some embodiments, after forming gate electrode 114, the process of replacing gate structure 1602 with gate structure 110 can further include depositing a sacrificial insulating material over insulating layer 206 (as previously discussed, insulating layer 206 is a component of ILD structure 130) and gate electrode 114, and planarizing the deposited sacrificial insulating material to form padding layer 214 (shown in FIG. 27) between each ILD structure 130. The sacrificial material and its deposition techniques can be similar to that of insulating layer 206 or STI region 104. In some embodiments, a top surface of padding layer 214 can be substantially coplanar with a top of insulating layer 206.

Figure 27:
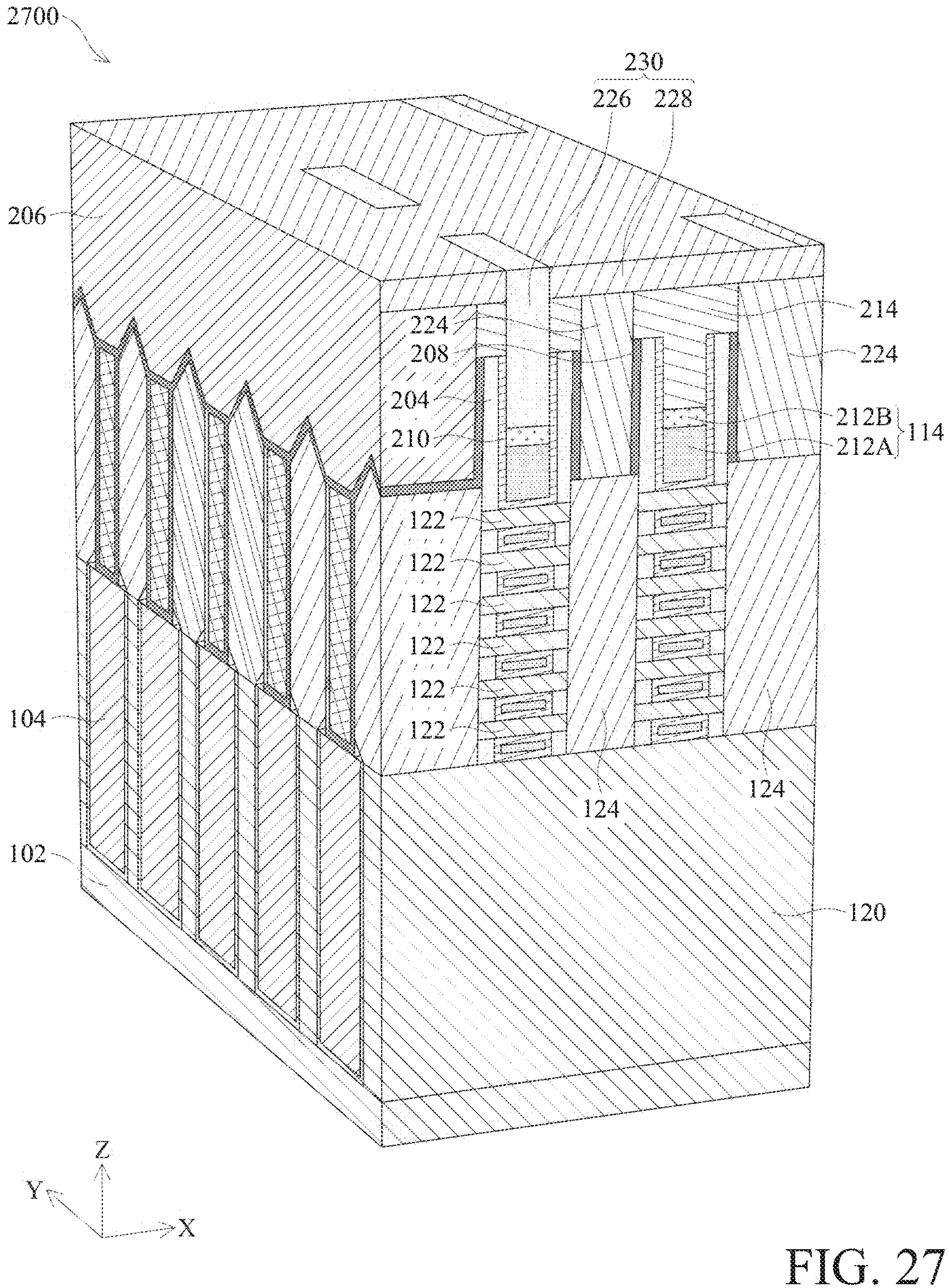
FIG. 27 is an isometric view of a semiconductor device, according to some embodiments.

Referring to FIG. 3, in operation 325, source/drain contact structures are formed. FIG. 27 is an isometric view of device 2700 after forming S/D contact structures 224. Although FIG. 27 shows six channel layers within channel region 122, any number of channel layers can be included channel region 122 in FIG. 27. The process of forming S/D contact structures 224 can include forming S/D contact openings within insulating layer 206 (e.g., ILD structure 130). The process of forming the S/D contact openings can include removing portions of insulating layer 206 that is overlying source-drain regions 124 and removing portions of CESL 208 under the etched portions of insulating layer 206. The process of removing the portions of insulating layer 206 can include patterning using photolithography to expose areas on top surface of insulating layer 206 corresponding to the portions of insulating layer 206 that are to be removed. The portions of insulating layer 206 can be removed by a dry etching process. The etching of the portions of insulating layer 206 can be followed by a dry etching of portions of CESL 208 under the etched portions of ILD layer 206. In some embodiments, the dry etching process for removing insulating layer 206 and/or CESL 208 can be a fluorine-based process.

The process of forming S/D contact structures 224 can further include forming metal silicide layers and/or conductive regions within the S/D contact openings. In some embodiments, the metal used for forming the metal silicide layers can include Co, Ti, and Ni. In some embodiments, the metal is deposited by ALD or CVD to form diffusion barrier layers (not shown in FIG. 27) along surfaces of the S/D contact openings. This deposition of diffusion barrier layers is followed by a rapid thermal annealing process at a temperature in a range from about 700° C. to about 900° C. to form the metal silicide layers.

The process of forming conductive regions can include deposition of a conductive material followed by a polishing process to coplanarize top surfaces of the conductive regions with top surfaces of ILD structure 130. The conductive materials can be, for example, W, Al, Co, Cu, or a suitable conductive material, and can be deposited by, for example, PVD, CVD, or ALD. The polishing process for coplanarizing the conductive region with ILD structure 130's top surface can be a CMP process. In some embodiments, the CMP process, can use a silicon or an aluminum abrasive with abrasive concentrations ranging from about 0.1% to about 3%. In some embodiments, the silicon or aluminum abrasive may have a pH level less than 7 for W metal in the conductive regions or can have a pH level greater than 7 for cobalt (Co) or copper (Cu) metals in the conductive regions.

Further, in operation 325, an interconnect structure can be formed over gate structures 110 and S/D contact structures 224. For example, as shown in FIG. 27, interconnect structure 230 can be formed over gate structures 110 and S/D contact structures 224. In some embodiments, the process of forming the interconnect structure can include depositing MEOL insulating layer 228 over padding layer 214 and S/D contact structures 224, forming a multiple trench openings within MEOL insulating layer 228 to expose a portion of gate electrode 114 and a portion of S/D contact structure 224, and forming trench conductor 226 into the trench openings and in contact with gate electrode 114 and/or S/D contact structure 224. In some embodiments, the process of forming the trench opening can use similar techniques as forming the S/D contact openings, such as a photolithography process, a wet etch process, or a dry etch process. In some embodiments, the process of forming trench conductor 226 can use similar techniques as forming the contact regions for S/D contact structure 224, such as a deposition process and a polishing process.

In some embodiments, a semiconductor structure can include a substrate and a gate structure over the substrate, where the gate structure can include two opposing spacers, a dielectric layer formed on side surfaces of the two opposing spacers, and a gate metal stack formed over the dielectric layer. A top surface of the gate metal stack can be below a top surface of the dielectric layer.

In some embodiments, a semiconductor structure can include a substrate, a first vertical structure over the substrate, a second vertical structure over the substrate, and a gate structure over a portion of the first vertical structure and over a portion of the second vertical structure. The first vertical structure can include a channel layer. The second vertical structure can include a dielectric stack. The gate structure can include two opposing spacers over the portion of the first vertical structure, a first dielectric layer disposed over side surfaces of the two opposing spacers, and a gate metal stack formed between the two opposing side surfaces of the first dielectric layer. The first dielectric layer can include two opposing side surfaces and top surfaces positioned above the two opposing side surfaces of the first dielectric layer. A top surface of the gate metal stack can be below the top surfaces of the first dielectric layer.

In some embodiments, a method can include forming a gate structure over a substrate, removing a first portion of the gate structure to form a first recess, forming a first dielectric layer over the first recess, and forming a gate electrode over a first portion of the first dielectric layer while exposing a second portion of the first dielectric layer. The process of forming the first dielectric layer can include forming the first portion of the first dielectric layer over a lower portion of side surfaces of the first recess, and forming the second portion of the first dielectric layer over an upper portion of the side surfaces of the first recess. A top surface of the gate electrode can be below a top of the first recess.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming, on a substrate, a vertical structure comprising first and second nanostructured layers;

depositing a semiconductor layer on sidewalls of the vertical structure;

forming, on the substrate, an isolation structure adjacent to the vertical structure;

forming a sacrificial gate structure on the vertical structure and the isolation structure;

removing the semiconductor layer, the second nanostructured layer, and the sacrificial gate structure to form a recess;

forming a gate dielectric layer in the recess, comprising:

forming a first portion of the gate dielectric layer in a lower portion of the recess; and forming a second portion of the gate dielectric layer in an upper portion of the recess; and forming a gate electrode on the first portion of the gate dielectric layer, wherein a top surface of the gate electrode is below a top surface of the gate dielectric layer.

2. The method of claim 1, wherein the forming the gate electrode comprises:

forming a gate metal stack in the recess; and selectively removing a portion of the gate metal stack formed on the second portion of the gate dielectric layer.

3. The method of claim 1, wherein forming the isolation structure comprises:

depositing a liner on the substrate;

depositing a first dielectric layer on the liner; and depositing a second dielectric layer on the liner and the first dielectric layer.

4. The method of claim 1, further comprising depositing a semiconductor layer on sidewalls of the vertical structure prior to forming the isolation structure.

5. The method of claim 1, wherein forming the gate electrode comprises depositing a metal layer between the first nanostructured layer and the isolation structure.

6. A method, comprising:

forming, on a semiconductor substrate, vertical structures having sacrificial layers and channel regions comprising one or more doped semiconductor materials;

depositing semiconductor layers on sidewalls of the vertical structures;

forming isolation structures between the vertical structures;

forming a sacrificial gate structure on top surfaces of the vertical structures and the isolation structures and on sidewalls of the semiconductor layers;

forming opposing gate spacers adjacent to the sacrificial gate structure;

removing the semiconductor layer, the sacrificial layers, and the sacrificial gate structure;

forming a gate dielectric layer on the isolation structures and the channel regions; and forming a gate metal stack on the gate dielectric layer, wherein the gate dielectric layer and the opposing gate spacers extend above a top surface of the gate metal stack.

7. The method of claim 6, further comprising forming a padding layer on the gate metal stack and the isolation structure.

8. The method of claim 6, wherein forming the gate metal stack comprises forming the gate metal stack between the channel regions and the isolation structure.

9. The method of claim 6, wherein forming the gate metal stack comprises depositing the gate metal stack on sidewalls of the isolation structure.

10. The method of claim 6, wherein forming the gate dielectric layer comprises forming a top surface of the gate dielectric layer coplanar with top surfaces of the opposing gate spacers.

11. The method of claim 6, further comprising removing the semiconductor layers prior to forming the gate dielectric layer.

12. The method of claim 6, wherein depositing the semiconductor layers comprises depositing silicon germanium layers.

13. A method, comprising:

forming, on a substrate, a first vertical structure, the first vertical structure comprising a channel region and a sacrificial layer;

depositing semiconductor layers on sidewalls of the first vertical structure;

forming, on the substrate, a second vertical structure over the substrate and on sidewalls of the semiconductor layer, the second vertical structure comprising a dielectric stack;

forming a sacrificial gate structure over the channel region of the first vertical structure;

forming two opposing spacers along sidewalls of the sacrificial gate structure;

forming a first dielectric layer over side surfaces of the two opposing spacers, the first dielectric layer comprising two opposing side surfaces and top surfaces substantially coplanar with top surfaces of the two opposing spacers;

removing the sacrificial layer, the semiconductor layers, and the sacrificial gate structure; and forming a gate metal stack between the two opposing side surfaces of the first dielectric layer, wherein a top surface of the gate metal stack is below the top surfaces of the first dielectric layer.

14. The method of claim 13, wherein forming the gate metal stack comprises forming the top surface of the gate metal stack below a top surface of the second vertical structure.

15. The method of claim 13, wherein forming the first dielectric layer comprises depositing the first dielectric layer on the channel region and the dielectric stack.

16. The method of claim 13, wherein forming the dielectric stack of the second vertical structure comprises forming a second dielectric layer and a third dielectric layer disposed over the second dielectric layer, wherein the second dielectric layer comprises a low-k dielectric material and the third dielectric layer comprises hafnium oxide ($HfO_2$), zirconium oxide ($ZrO_2$), aluminum oxide ($Al_2O_3$), hafnium aluminum oxide ($HfAlO_x$), hafnium silicon oxide ($HfSiO_x$), or a high-k dielectric material.

17. The method of claim 13, wherein forming the channel region of the first vertical structure comprises forming a layer of silicon or silicon-germanium.

18. The method of claim 13, wherein forming the gate metal stack comprises:

depositing a metal layer on the first dielectric layer; and etching the metal layer to expose a top portion of the first dielectric layer.

19. The method of claim 13, wherein forming the first vertical structure comprises forming the first vertical structure with a top surface below a top surface of the second vertical structure.

20. The method of claim 13, further comprising depositing an insulating layer on a top surface of the gate metal stack and on a top surface and sidewalls of the second vertical structure.

* * * * *